United States Patent
Bergin et al.

(10) Patent No.: US 10,324,453 B2
(45) Date of Patent: Jun. 18, 2019

(54) SPACE FOR MATERIALS SELECTION

(71) Applicant: AUTODESK, INC., San Rafael, CA (US)

(72) Inventors: Michael Bergin, El Cerrito, CA (US); Mark Thomas Davis, Mill Valley, CA (US); Maryam Maleki, Seattle, WA (US)

(73) Assignee: AUTODESK, INC., San Rafael, CA (US)

( * ) Notice: Subject to any disclaimer, the term of this patent is extended or adjusted under 35 U.S.C. 154(b) by 591 days.

(21) Appl. No.: 14/951,327

(22) Filed: Nov. 24, 2015

(65) Prior Publication Data

US 2016/0147912 A1    May 26, 2016

Related U.S. Application Data

(60) Provisional application No. 62/084,490, filed on Nov. 25, 2014.

(51) Int. Cl.
*G06F 17/50* (2006.01)
*G05B 19/4097* (2006.01)
(Continued)

(52) U.S. Cl.
CPC ....... *G05B 19/4097* (2013.01); *G06F 3/0481* (2013.01); *G06F 3/04847* (2013.01);
(Continued)

(58) Field of Classification Search
CPC .............. G06F 17/50; G06F 17/5004
(Continued)

(56) References Cited

U.S. PATENT DOCUMENTS 8,392,160 B2 * 3/2013 Brincat ............... G06F 17/5009
                                              703/6
8,818,769 B2 * 8/2014 Trainer ................. G06F 17/50
                                              703/1
(Continued)

FOREIGN PATENT DOCUMENTS

JP         05-081355 A    4/1993

OTHER PUBLICATIONS

Arieff, A. 2013. New Forms that Function Better. MIT Technology Review http://www.technologyreview.com/review/517596/new-formsthat-function-better/ pp. 1-10.
(Continued)

*Primary Examiner* — Andy Ho
(74) *Attorney, Agent, or Firm* — Artegis Law Group, LLP

(57) ABSTRACT

A design application generates a spectrum of design options that meet certain design criteria. Each design option may potentially be composed of a different type of material. The design application filters the spectrum of design options for presentation in a graphical user interface (GUI). The GUI illustrates different design options based on material of composition within a parallel axis plot that includes separate axes for different material attributes. The GUI also displays envelopes of design options for each different material or material type, where each envelope has a different color, pattern, opacity, or other visual attribute. A GUI engine dynamically updates the GUI to reflect constraints and other design criteria applied to the spectrum of design options.

26 Claims, 29 Drawing Sheets

(51) Int. Cl.
*G06F 16/44* (2019.01)
*G06F 3/0481* (2013.01)
*G06F 3/0484* (2013.01)
*G06T 15/10* (2011.01)
*G06T 19/20* (2011.01)

(52) U.S. Cl.
CPC ............ *G06F 16/444* (2019.01); *G06F 17/50* (2013.01); *G06F 17/5009* (2013.01); *G06T 15/10* (2013.01); *G06T 19/20* (2013.01); *G05B 2219/32089* (2013.01); *G05B 2219/35012* (2013.01); *G05B 2219/35021* (2013.01); *G05B 2219/49301* (2013.01); *Y02P 80/40* (2015.11)

(58) Field of Classification Search
USPC .......................................................... 703/1
See application file for complete search history.

(56) References Cited

U.S. PATENT DOCUMENTS

2014/0108953 A1* 4/2014 Greene ............... G06F 3/04842
715/747
2015/0324489 A1 11/2015 Onodera

OTHER PUBLICATIONS

Bertini, E., Dell'Aquila, L., & Santucci, G. 2005. "SpringView: cooperation of radviz and parallel coordinates for view optimization and clutter reduction". In Coordinated and Multiple Views in Exploratory Visualization. (8 pages).

Draper, G., Livnat, Y., & Riesenfeld, R. F. 2009. "A survey of radial methods for information visualization". In Visualization and Computer Graphics. pp. 1-45.

Dunne, C. and Shneiderman, B. 2013. "Motif simplification: improving network visualization readability with fan, connector, and clique glyphs". In Proc CHI '13 (14 pages).

Flager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12.

Flager F, Welle B, Bansal P, Soremekun G, Haymaker J. 2009. "Multidisciplinary process integration and design optimization of a classroom building". Journal of Information Technology in Construction, vol. 14. 595-612.

Gerber, D. J., Lin, S.-H., Pan, B. and Solmaz, A. S. 2012. "Design optioneering: multi-disciplinary design optimization through parameterization, domain integration and automation of a genetic algorithm". In Proc. Symposium on Simulation for Architecture and Urban Design, Society for Computer Simulation International. (pp. 23-30).

Graham, M., & Kennedy, J. 2003. "Using curves to enhance parallel coordinate visualisations". In Information Visualization, 2003.

Grossman, T., Matejka, T. and Fitzmaurice, G. 2010. "Chronicle: capture, exploration, and playback of document workflow histories". In Proc UIST '10. (pp. 143-152).

Hauser, H., Ledermann, F., & Doleisch, H. 2002. "Angular brushing of extended parallel coordinates". In Information Visualization, 2002. (4 pages).

Holzer, D., Hough, R. and Burry, M. 2007. "Parametric Design and Structural Optimisation for Early Design Exploration". International, Journal of Architectural Computing, vol. 5, 4. 625-643.

Lunzer, A. and Hornbæk, K. 2008. "Subjunctive interfaces: Extending applications to support parallel setup, viewing and control of alternative scenarios". ACM Transactions on Computer-Human Interaction vol. 14, 4. 1-17.

Maile, T., Fischer, M., Bazjanac, V. 2007. "Building energy performance simulation tools—a life-cycle and interoperable perspective". Working Paper. Center for Integrated Facility Engineering, Stanford University. (47 pages).

Marks, J., Andalman, B., Beardsley, P. A., Freeman, W., Gibson, S., Hodgins, J., . . . & Shieber, S. 1997. "Design galleries: A general approach to setting parameters for computer graphics and animation". In Proc. of the 24th annual conference on Computer graphics and interactive techniques.

Shah, J., Vergas-Hernandez, N., Smith, S. 2003. "Metrics for measuring ideation effectiveness". Design Studies vol. 24. 111-134.

Shneiderman, B. 1996. "The eyes have it: A task by data type taxonomy for information visualizations". In Proc. of IEEE Symposium on Visual Languages. (pp. 336-343).

Shneiderman, B., Hewett, T., Fischer, G., Jennings, P. 2006. et al. "Creativity Support Tools: Report from a US National Science Foundation Sponsored Workshop". International Journal of Human Computer Interaction, 20, 2. 61-77.

Steed, C. A., Fitzpatrick, P. J., Jankun-Kelly, T. J., Yancey, A. N., & Swan II, J. E. 2009. "An interactive parallel coordinates technique applied to a tropical cyclone climate analysis". Computers & Geosciences. (pp. 1-40).

Strauss, A. and Corbin, J. 1998. "Basics of qualitative research: Techniques and procedures for developing grounded theory". Thousand Oaks, CA: Sage. (133 pages).

Terry, M. Mynatt, E.D., Nakakoji, K., and Yamamoto, Y. 2004. "Variation in element and action: supporting simultaneous development of alternative solutions". In Proc CHI '04 (pp. 711-718).

Thibodeau, T. 2013. "U.S. makes a Top 10 supercomputer available to anyone who can 'boost' America". In www.computerworld.com.

Ward, M. O. 1994. "Xmdvtool: Integrating multiple methods for visualizing multivariate data". In Proc. of the Conference on Visualization. (9 pages).

Ward, M. O. 2002. "A taxonomy of glyph placement strategies for multidimensional data visualization". Information Visualization. (pp. 194-210).

Wegman, E. J. 1990. "Hyperdimensional data analysis using parallel coordinates". Journal of the American Statistical Association. (pp. 664-675).

Wong, P.C., & Bergeron, R.D. 1994. "30 Years of Multidimensional Multivariate Visualization". In Scientific Visualization. (pp. 1-30).

Non-final Office Action for U.S. Appl. No. 14/951,310 dated Jun. 7, 2018, 21 pages.

* cited by examiner

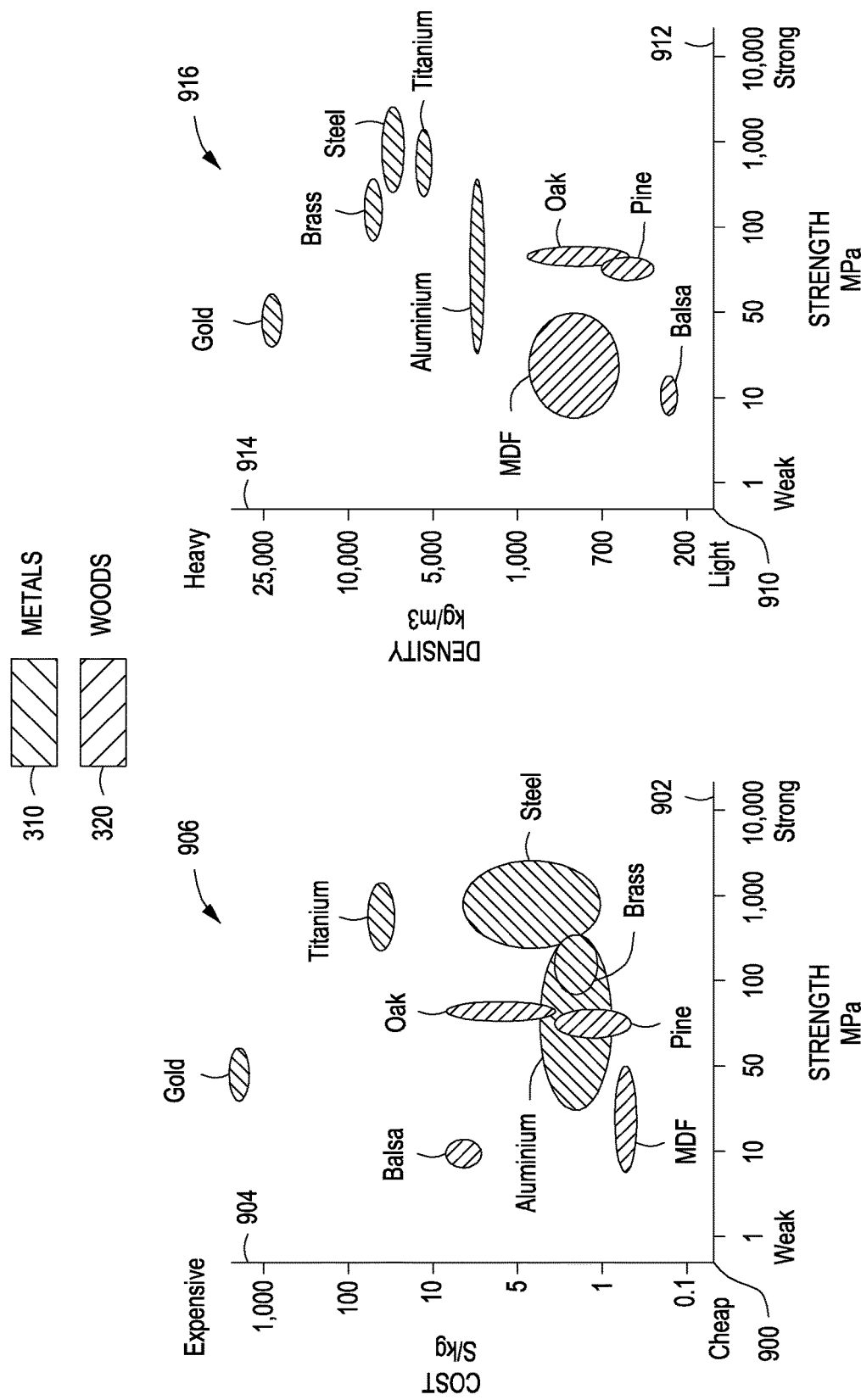

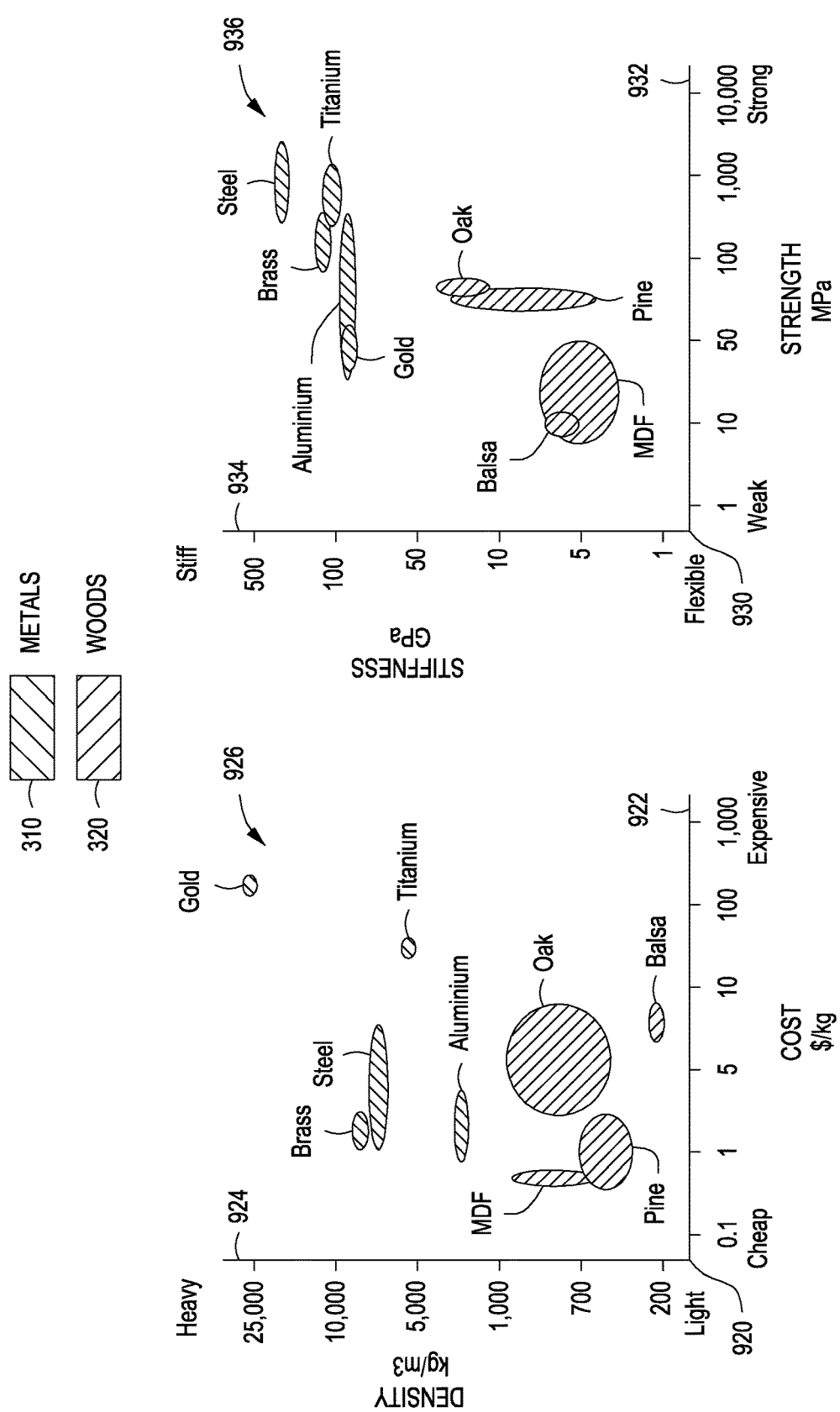

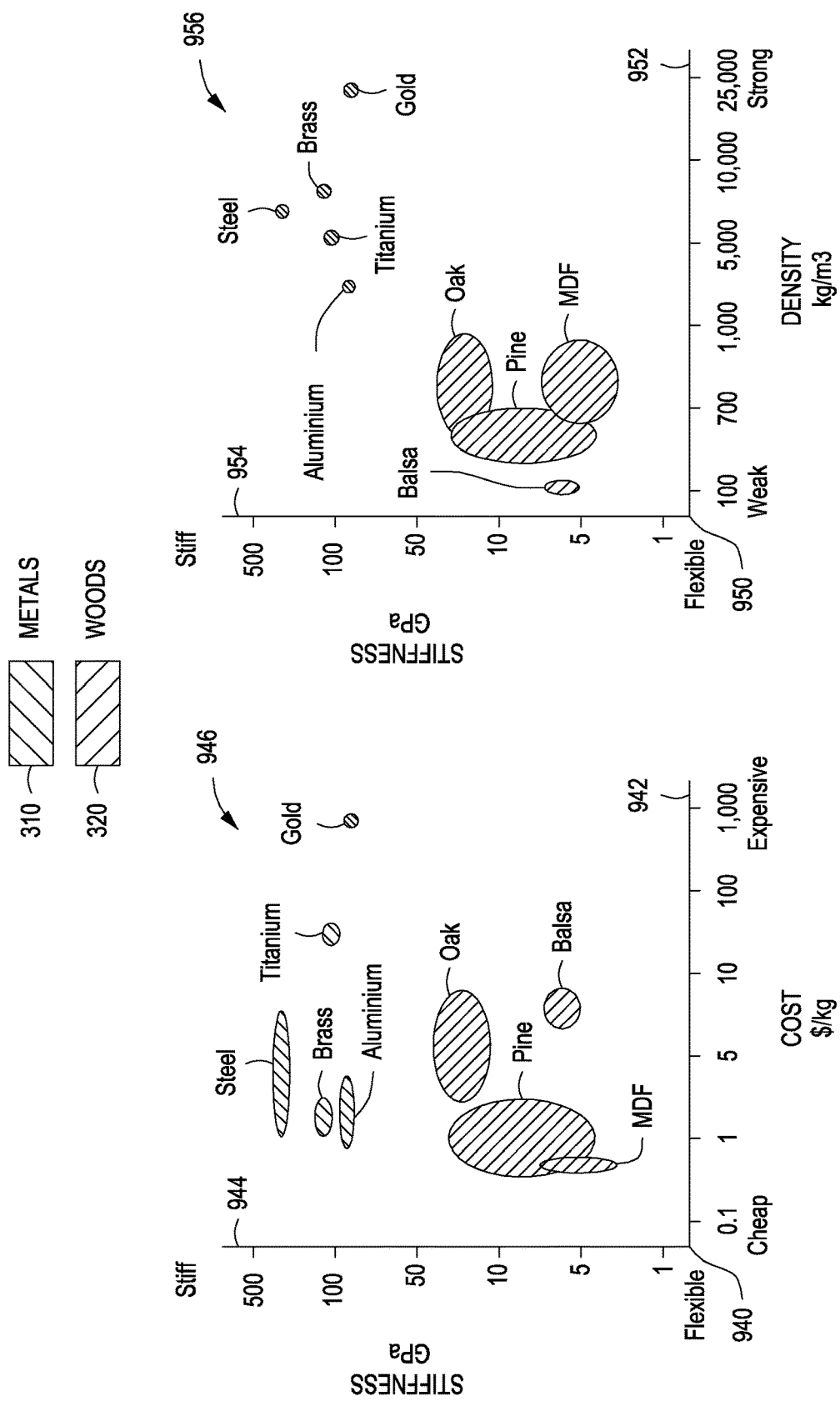

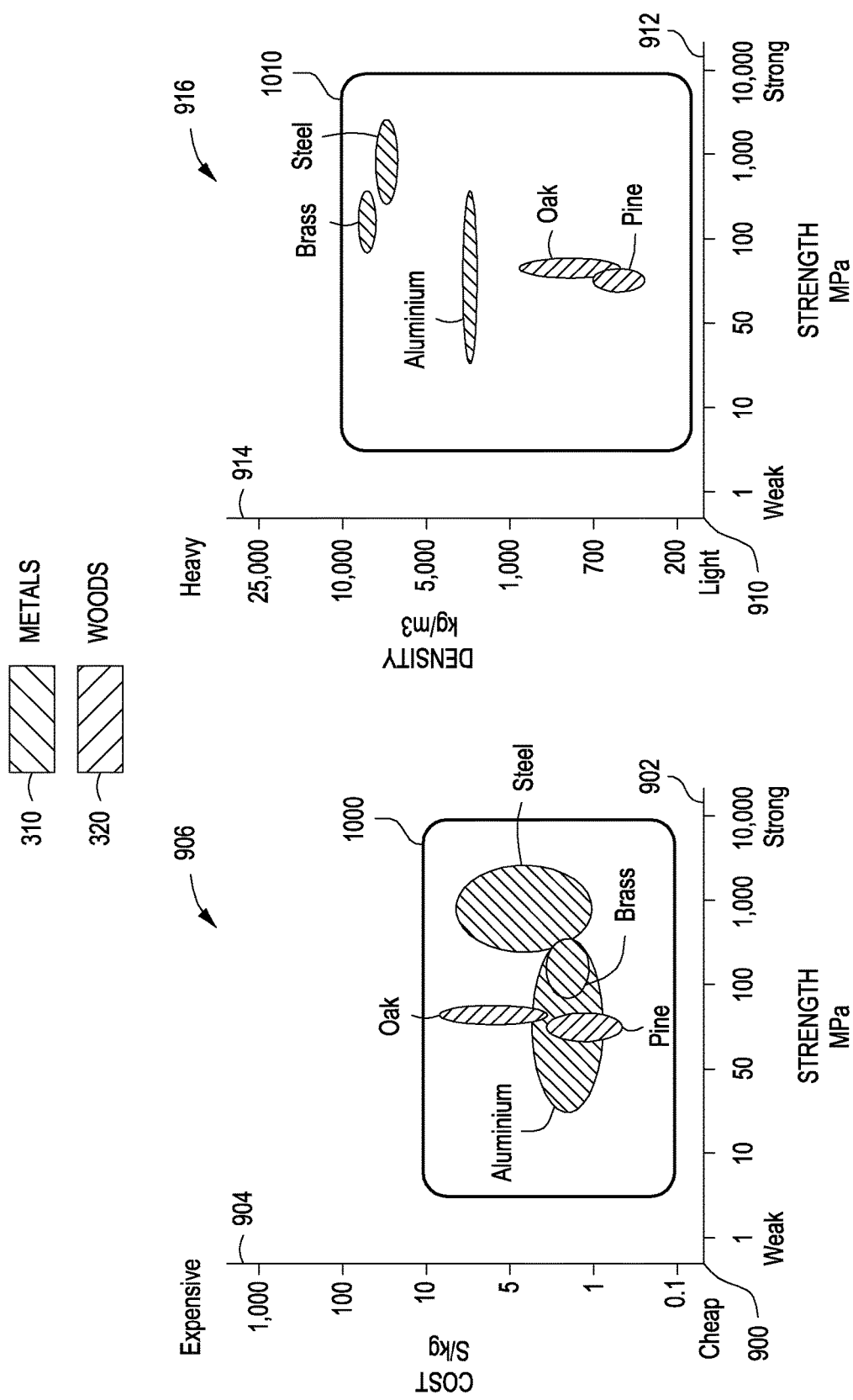

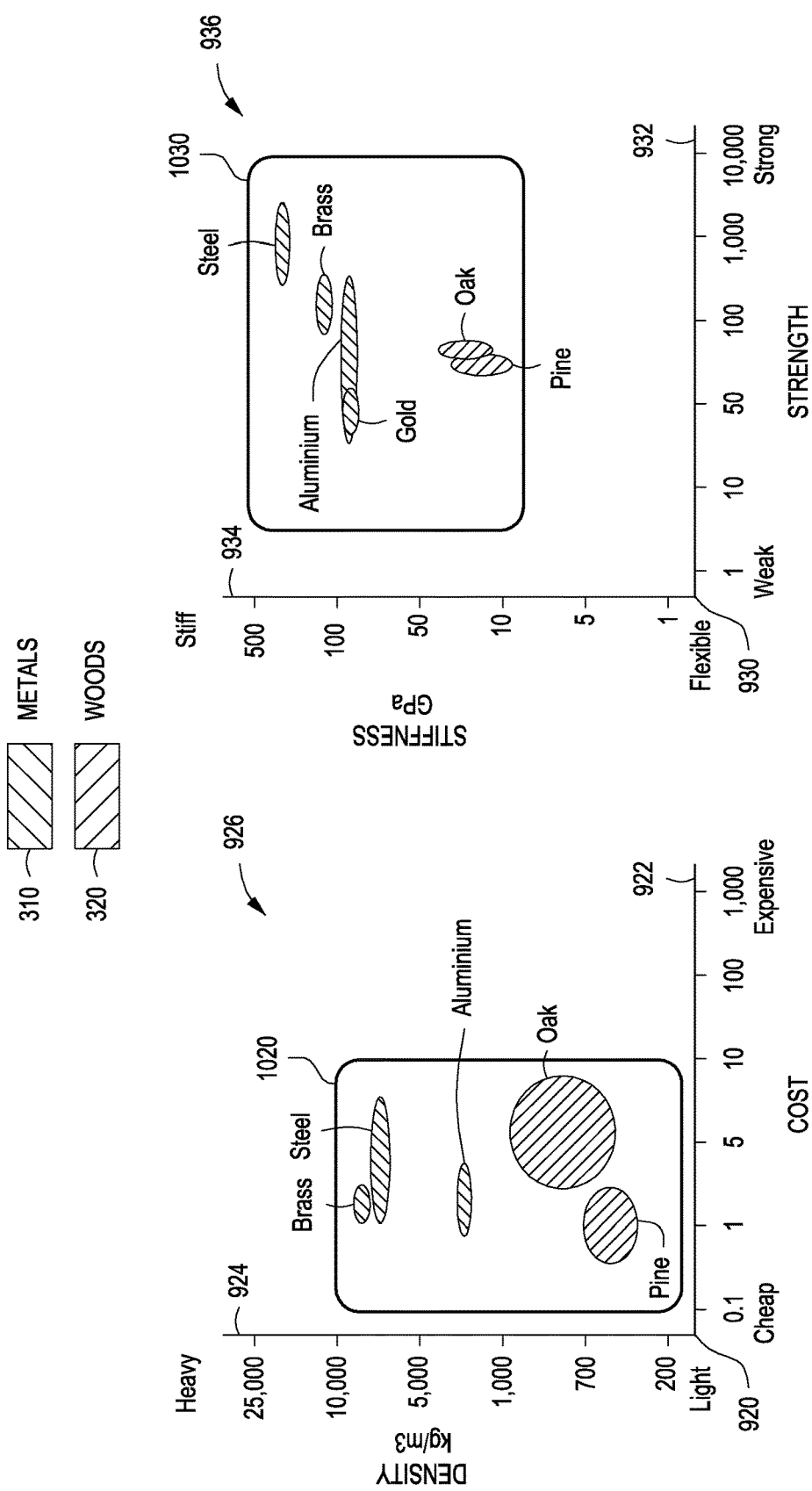

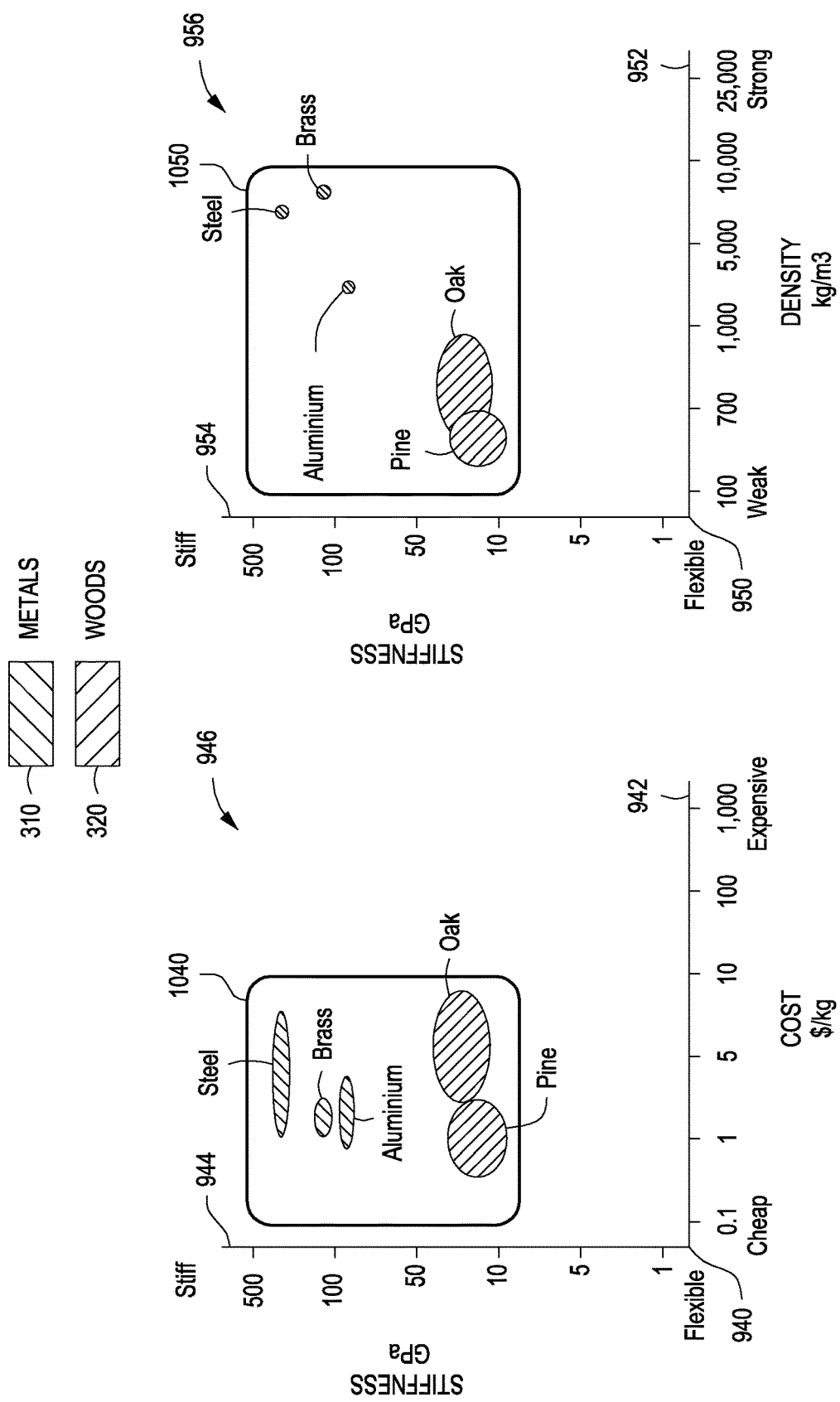

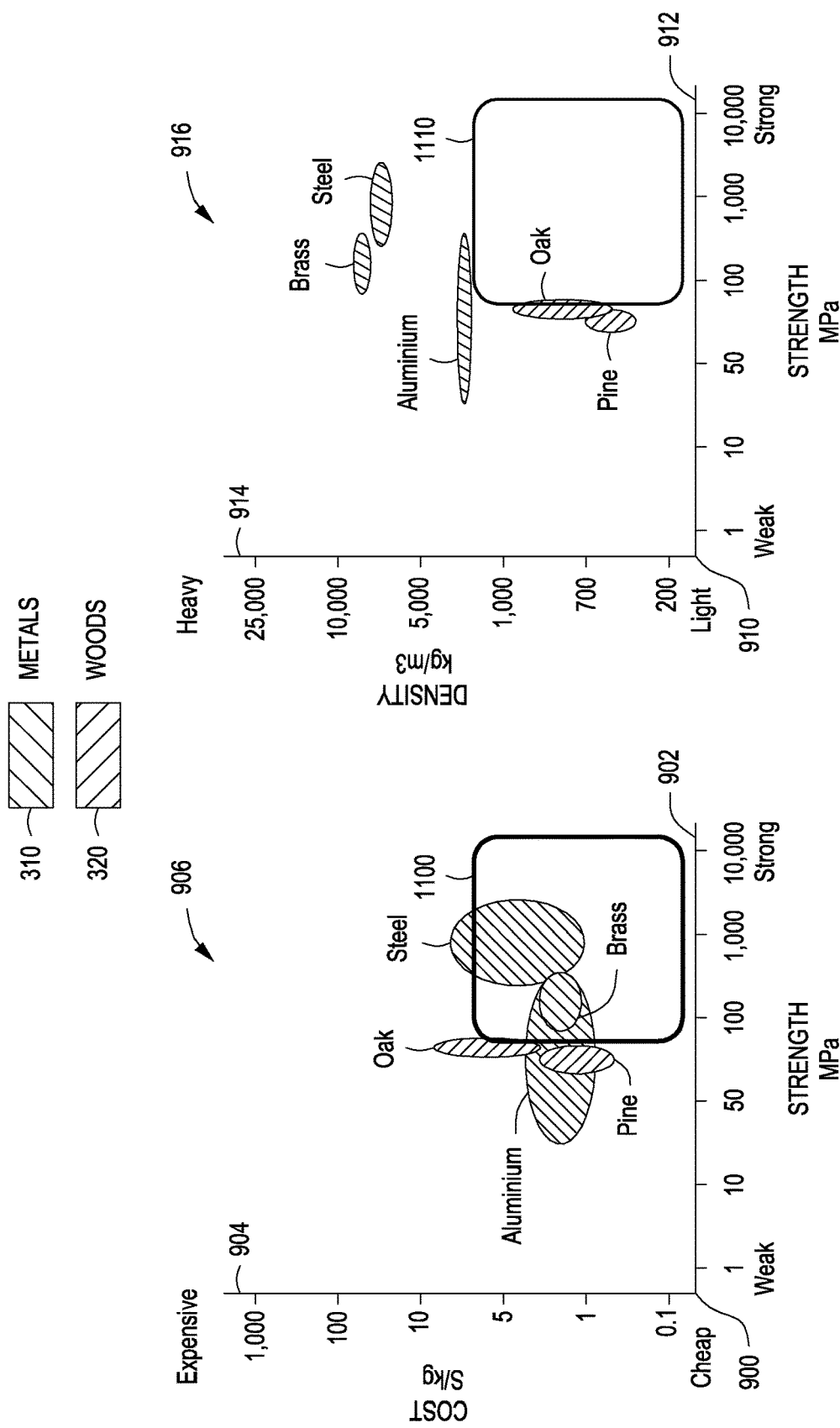

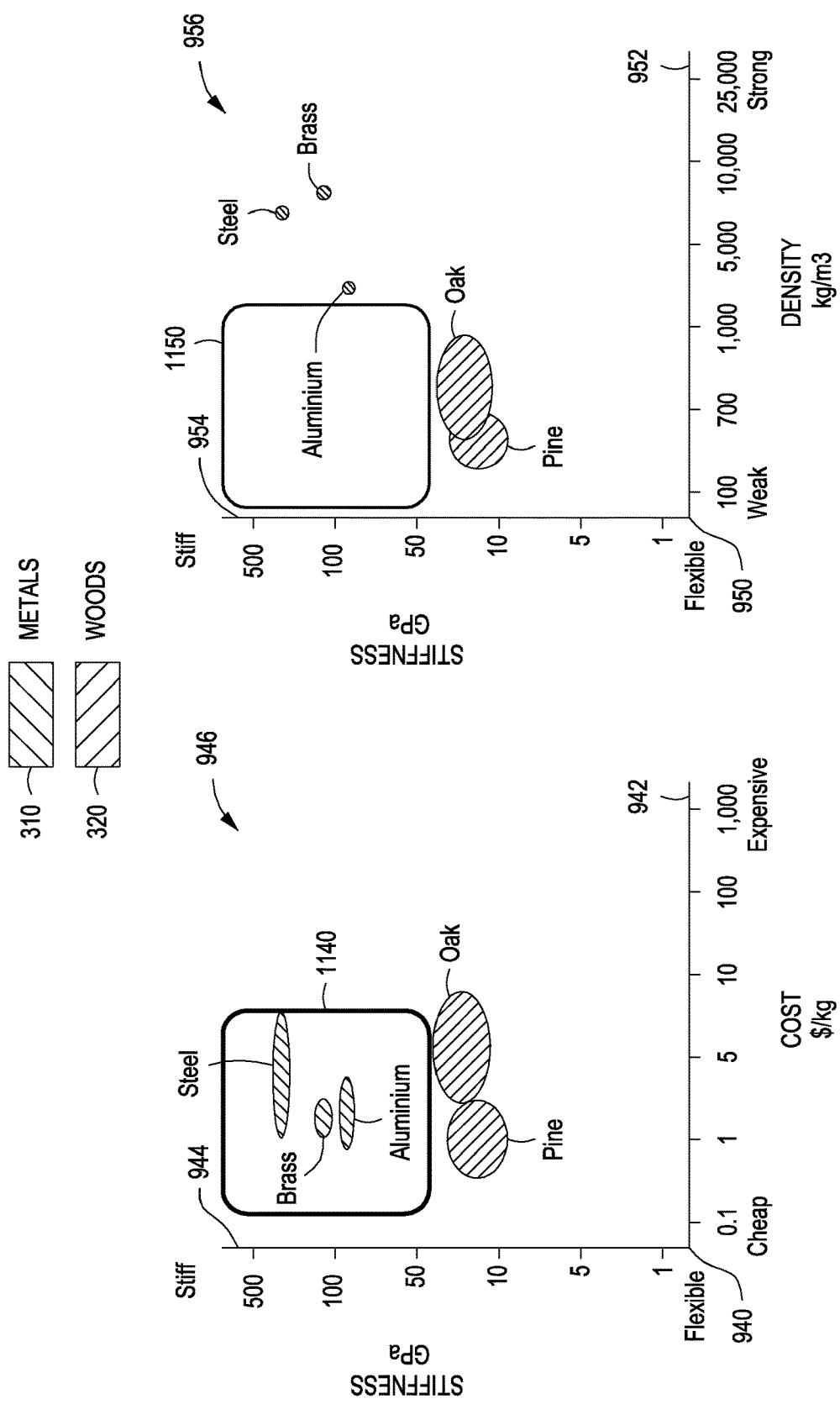

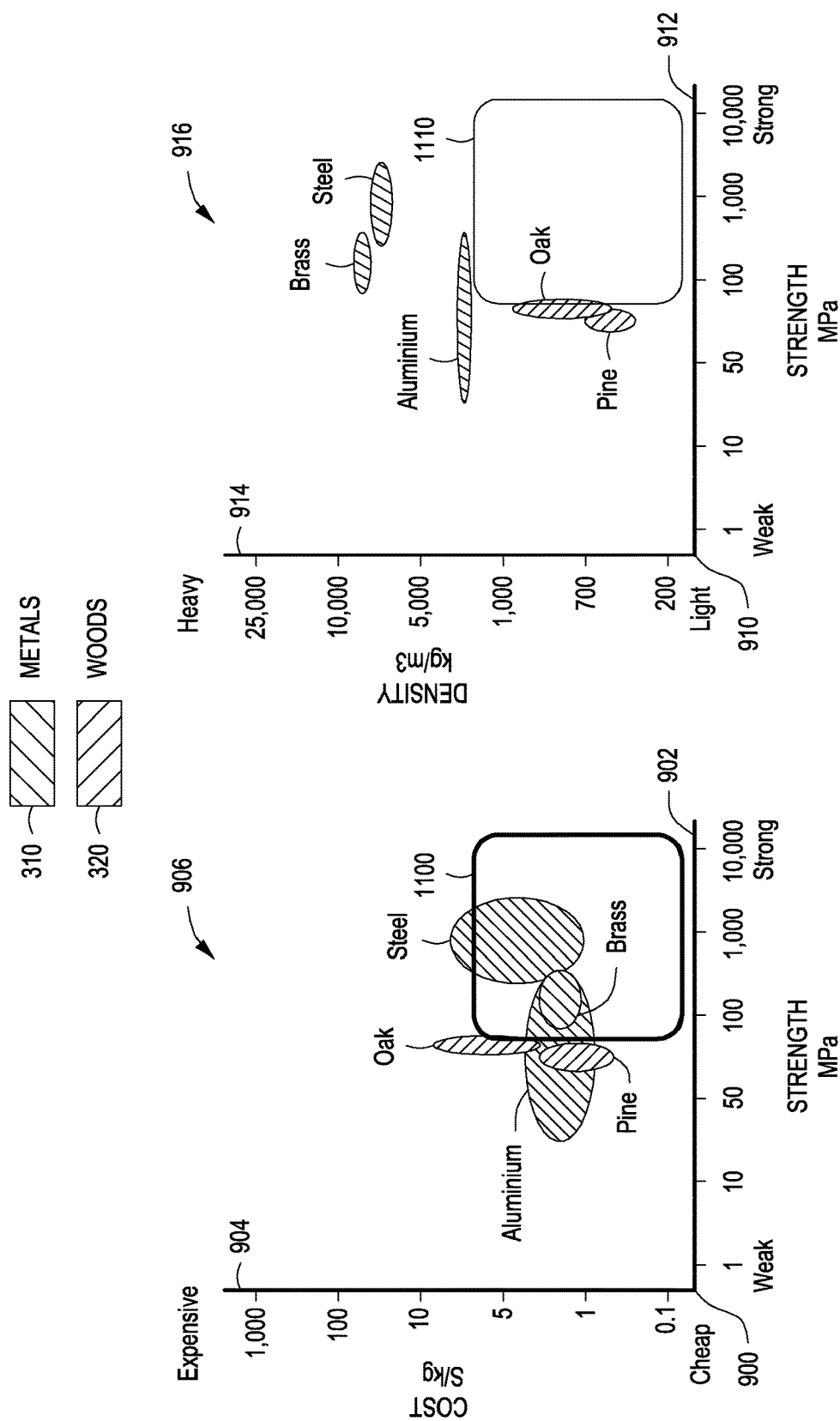

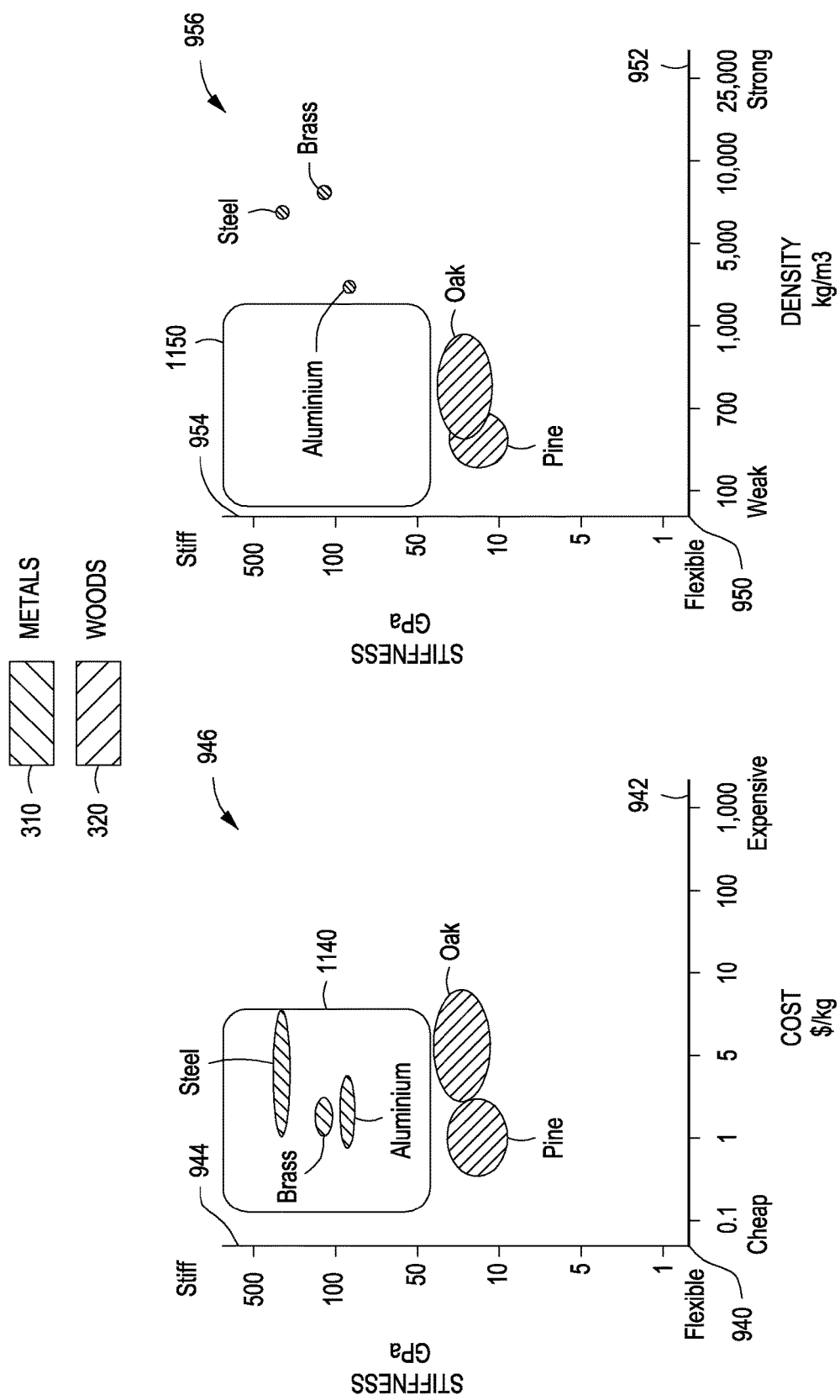

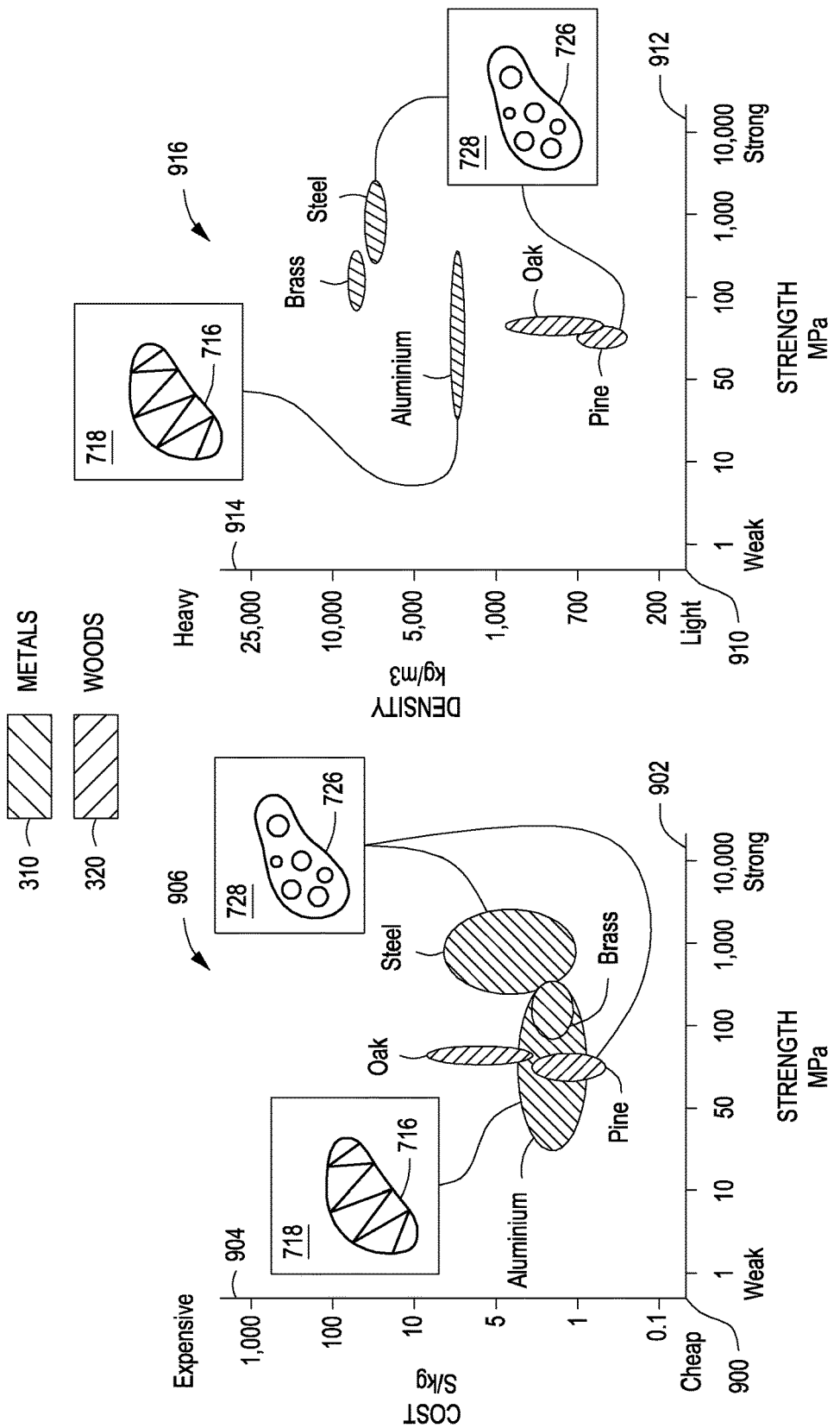

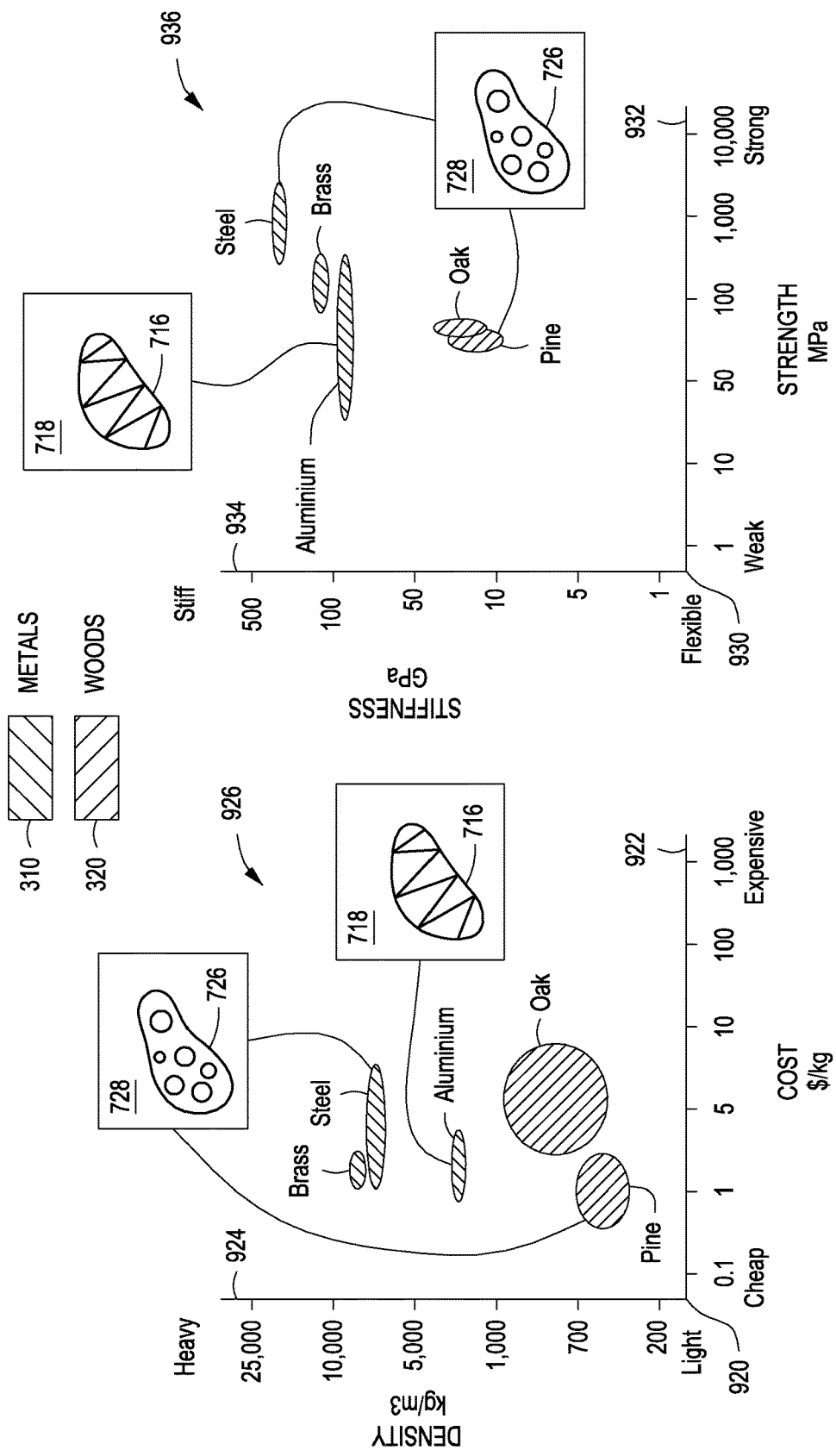

SPACE FOR MATERIALS SELECTION

CROSS-REFERENCE TO RELATED APPLICATIONS

This application claims the benefit of United States provisional patent application titled "Dreamcatcher: Approaches for Design Variation," filed on Nov. 25, 2014 and having Ser. No. 62/084,490. The subject matter of this related application is hereby incorporated herein by reference.

BACKGROUND OF THE INVENTION

Field of the Invention

Embodiments of the present invention relate generally to engineering design and, more specifically, to a design space for materials selection.

Description of the Related Art

In a typical design process, an engineer evaluates a set of design criteria associated with a design problem, and then generates geometry that solves the design problem. The engineer may then select a specific material for fabricating the geometry. The engineer analyzes a simulated instance of the geometry, composed of the selected material, via a computer simulation. If the results of the simulation prove that the current design, when constructed from the selected material, fails to meet the design criteria, then the engineer must modify the design and/or the selection of materials.

For example, in designing a bridge that must support specific loads and span a certain distance, an engineer could generate an assembly of trusses having particular geometry that spans the requisite distance. Then, the engineer could select a material, such as steel for the bridge, and generate a simulation of a steel bridge that spans the requisite distance. If the engineer were then to determine that the simulated steel bridge cannot support the necessary loads, then the engineer would have to modify the bridge design and/or the choice of materials and generate another simulation.

One drawback of the above approach is that an engineer oftentimes ends up performing multiple design simulations, which requires the engineer to create multiple designs and test each design with one or more different materials until an acceptable design is found. With complex designs that may be composed of a wide range of different materials, this process can be highly tedious and time-consuming. In particular, when hundreds or thousands of design options exist, potentially composed from any of a number of different materials, the engineer is required to manually evaluate each different design option. Also, when an acceptable design is found, there is no way to know whether that design represents the best possible design.

As the foregoing illustrates, what is needed in the art is a more effective approach for evaluating designs.

SUMMARY OF THE INVENTION

Various embodiments of the present invention sets forth a non-transitory computer-readable medium including instructions that, when executed by a processor, cause the processor to compare a plurality of design options, by performing the steps of generating a spectrum of design options, where each design option included in the spectrum satisfies at least one design criterion, filtering the spectrum of design options to identify a first subset of design options associated with a first material type, and generating a first envelope that represents the first subset of design options and indicates a first range of values on a first axis corresponding to a first attribute of the first material type and a second range of values on a second axis corresponding to a second attribute of the first material type.

At least one advantage of the disclosed approach is that end-users are no longer required to manually and individually evaluate the material attributes associated with each and every design option from a potentially vast collection of design options.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 9A-F illustrates a collection of plots, where each plot illustrates two material attributes associated with the spectrum of design options plotted against one another, according to various embodiments of the invention;

FIGS. 10A-F illustrates limiting regions projected onto the collection of plots of FIGS. 9A-F, according to various embodiments of the invention;

FIGS. 11A-F illustrates fitness boundaries proximate to materials that meet design criteria, according to various embodiments of the invention;

FIGS. 12A-F illustrates the plots in FIGS. 9A-F with material attribute weightings, according to various embodiments of the invention;

FIGS. 13A-F illustrates individual design options having optimal weighted fitness, according to various embodiments of the invention.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
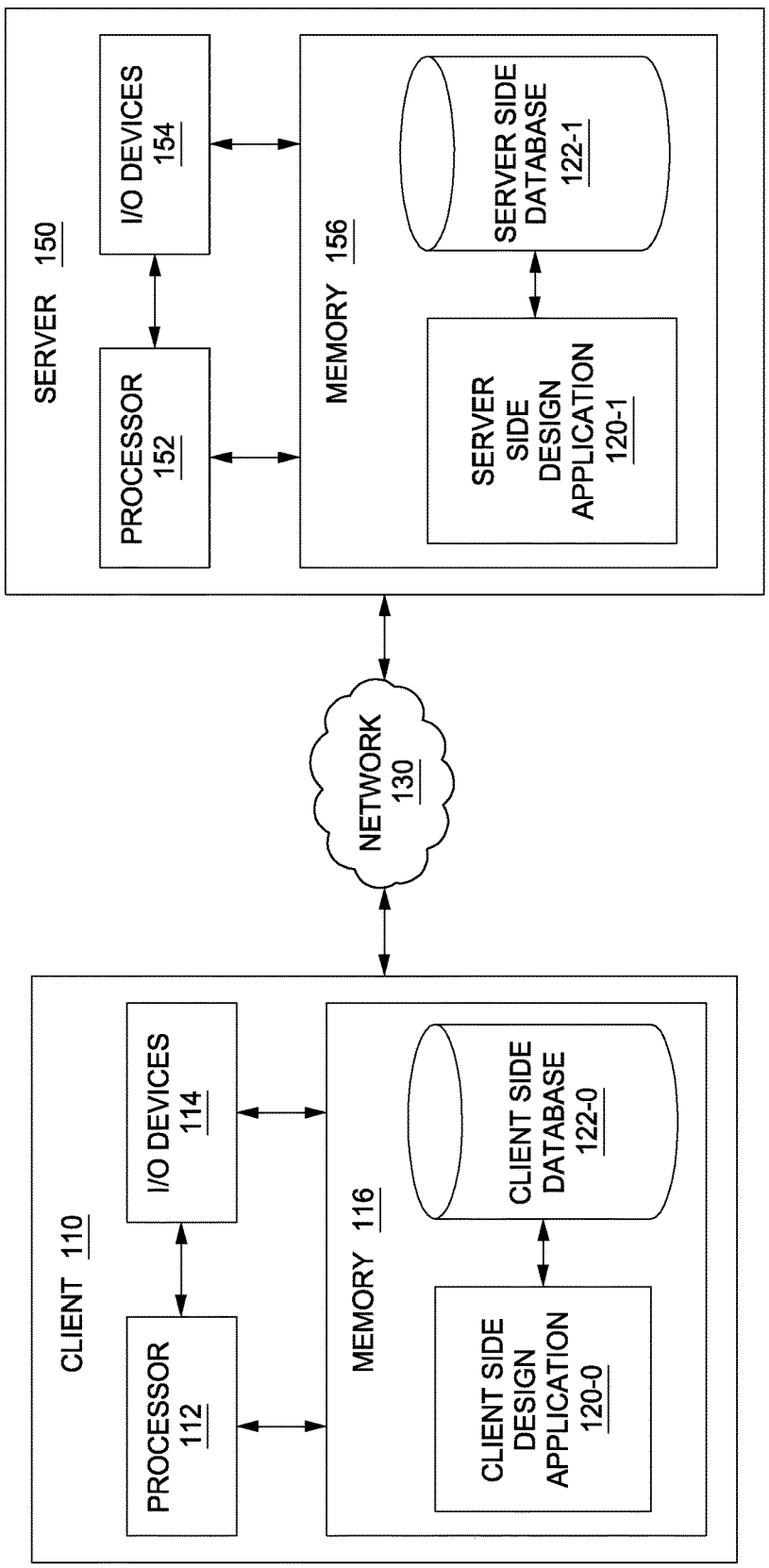
FIG. 1 illustrates a system configured to implement one or more aspects of the present invention.

FIG. 1 illustrates a system 100 configured to implement one or more aspects of the present invention. As shown, system 100 includes, without limitation, a client 110 coupled via a network 130 to a server 150. Client 110 may be any technically feasible variety of client computing device, including a desktop computer, laptop computer, mobile device, and so forth. Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a portion of a datacenter, and so forth.

Client 110 includes processor 112, input/output (I/O) devices 114, and memory 116, coupled together. Processor 112 may be any technically feasible form of processing device configured process data and execute program code. Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive and provide input and output, respectively, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth. Memory 116 includes client-side design application 120-0 and client-side database 122-0. Client-side design application 120-0 is a software application that, when executed by processor 112, causes processor 112 to generate a spectrum of design options and to display various plots for comparing those design options and materials associated with those design options. In doing so, client-side design application 120-0 may store and update data within client-side database 122-0 that includes the spectrum of design options. Client-side design application 120-0 may also interoperate with a corresponding design application that resides within server 150, and access a database that also resides on server 150, as described in greater detail below.

Server 150 includes processor 152, I/O devices 154, and memory 156, coupled together. Processor 152 may be any technically feasible form of processing device configured process data and execute program code, including a CPU, a GPU, an ASIC, an FPGA, and so forth. I/O devices 114 may include devices configured to receive input, devices configured to provide output, and devices configured to both receive and provide input and output.

Memory 156 may be any technically feasible storage medium configured to store data and software applications, including a hard disk, a RAM module, a ROM, and so forth. Memory 156 includes server-side tracking engine 120-1 and server-side design space database 122-1. Server-side design application 120-1 is a software application that, when executed by processor 152, causes processor 152 to generate a spectrum of design options and to display various plots for comparing those design options and materials associated with those design options. In doing so, server-side design application 120-1 may store and update data within server-side database 122-1 that includes the spectrum of design options. Server-side design application 120-0 may also interoperate with client-side design application 120-0, and access database 122-0.

In operation, client-side design application 120-0 and server-side design application 120-1 interoperate with one another to implement any and all of the inventive functionality described herein. In doing so, either one or both of client-side design application 120-0 and server-side design application 120-1 may access either one or both of client-side database 122-0 and server-side database 122-1. Generally, client-side design application 120-0 and server-side design application 120-1 represent different portions of single distributed software entity. Thus, for simplicity, client-side design application 120-0 and server-side design application 120-1 will be referred to collectively as design application 120. Similarly, client-side database 122-0 and server-side database 122-1 represent different portions of a single distributed storage entity. Therefore, for simplicity, client-side database 122-0 and server-side database 122-1 will be referred to collectively as database 122. Design application 120 is described in greater detail below in conjunction with FIG. 2.

Figure 2:
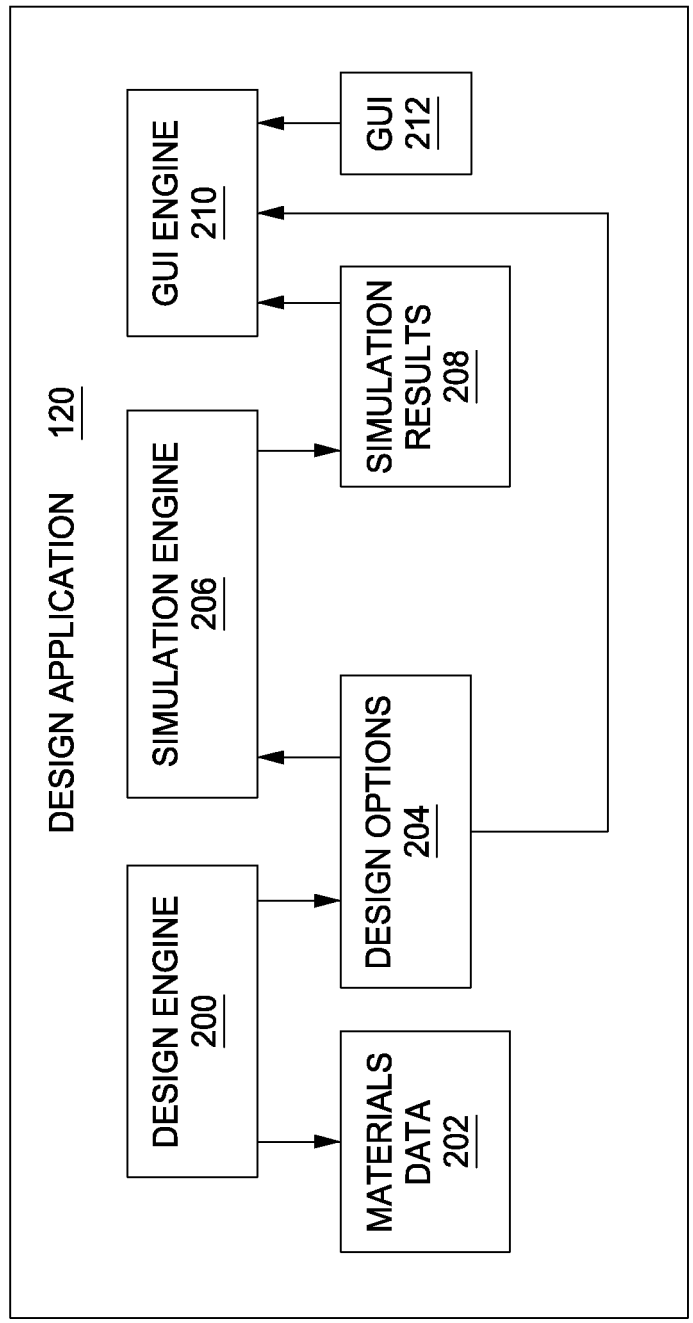
FIG. 2 is a more detailed illustration of the design application of FIG. 1, according to various embodiments of the invention.

FIG. 2 is a more detailed illustration of the design application of FIG. 1, according to various embodiments of the invention. As shown, design application 120 includes, without limitation, a design engine 200, materials data 202, design options 204, simulation engine 206, simulation results 208, GUI engine 210, and selection GUI 212.

Design engine 200 is a software application that is configured to generate engineering designs. A "design," as referred to herein, may refer to any sort of three-dimensional geometry composed of a specific material, including a mechanical component, an assembly of components, a circuit layout, a semiconductor schematic, or any combination thereof. Design engine 200 may include a range of tools for generating any technically feasible type of 3D design. Design engine 200 could be, for example, CAD tool, an engineering simulation program, or any other technically feasible tool for designing physical objects.

Materials data 202 defines static and dynamic attributes of a wide range of different physical materials. For a given material, those attributes could include, for example, density, thermal conductivity, strength, hardness, Young's modulus, Poisson Ratio, ductility, and so forth.

Design engine 200 is configured to access materials data 202 in order to generate design options 204. In doing so, design engine 200 receives data that defines a design problem to be solved by some potential design. The design problem data establishes bounding geometry associated with the design problem, specifies various positions where loads must be balanced, indicates positions where loads are applied to the bounding geometry, and designates positions where obstacles preclude the placement of geometry. Based on this design problem data, design engine 200 executes a multi-objective solver to generate design options 204, where each design option 204 is associated with one of the materials defined in materials data 202. The multi-objective solver could be, for example, a design optimization algorithm, a topology optimization algorithm, a genetic algorithm, and so forth. Each design option 204 generated in this fashion includes specific 3D geometry that, when fabricated with the associated material, potentially solves the design problem.

Simulation engine 206 is an engineering simulation program that simulates each design option 204, constructed for simulation with the associated material, under conditions associated with the design problem. Simulation engine 206 could execute a finite element analysis (FEM) solver, among other possibilities, in order to determine static and dynamic properties of a given design option 204 when composed of the associated material. Simulation engine 206 may rely on the design problem input mentioned above in order to construct a simulated environment for testing each design option 204. For each such option, simulation engine 206 generates simulation results 208.

Simulation results 208 include various attributes other physical properties associated with each design option 204. For a given design option 204, those attributes could include, for example, mass, density, volume, cost, maximum stress, and so forth. For a given design option 204, the values of these different attributes may vary based on the 3D geometry associated with the design option 204 and based on the material associated with that design option. In one embodiment, simulation engine 206 interoperates with design engine 200 in order to evaluate certain design options to determine whether the design criteria has been met. Then, simulation engine 206 may feedback simulation results to design engine 200 to assist design engine 200 with identifying feasible designs.

GUI engine 210 is a graphical rendering application. GUI engine 210 processes design options 204 and simulation results 208 and filters specific design options to be displayed to the end-user. In doing so, GUI engine 210 is configured to analyze potentially hundreds of thousands of design options 204 and to categorize these design options based on material of manufacture. GUI engine 210 then generates GUI 212 to illustrate those design options organized based on the particular material or material type associated with each such design option. FIGS. 3A-7 and 9-13 illustrate exemplary screenshots of GUI 212.

Generating a Parallel Axis Plot for Material Comparison

Figure 3A:
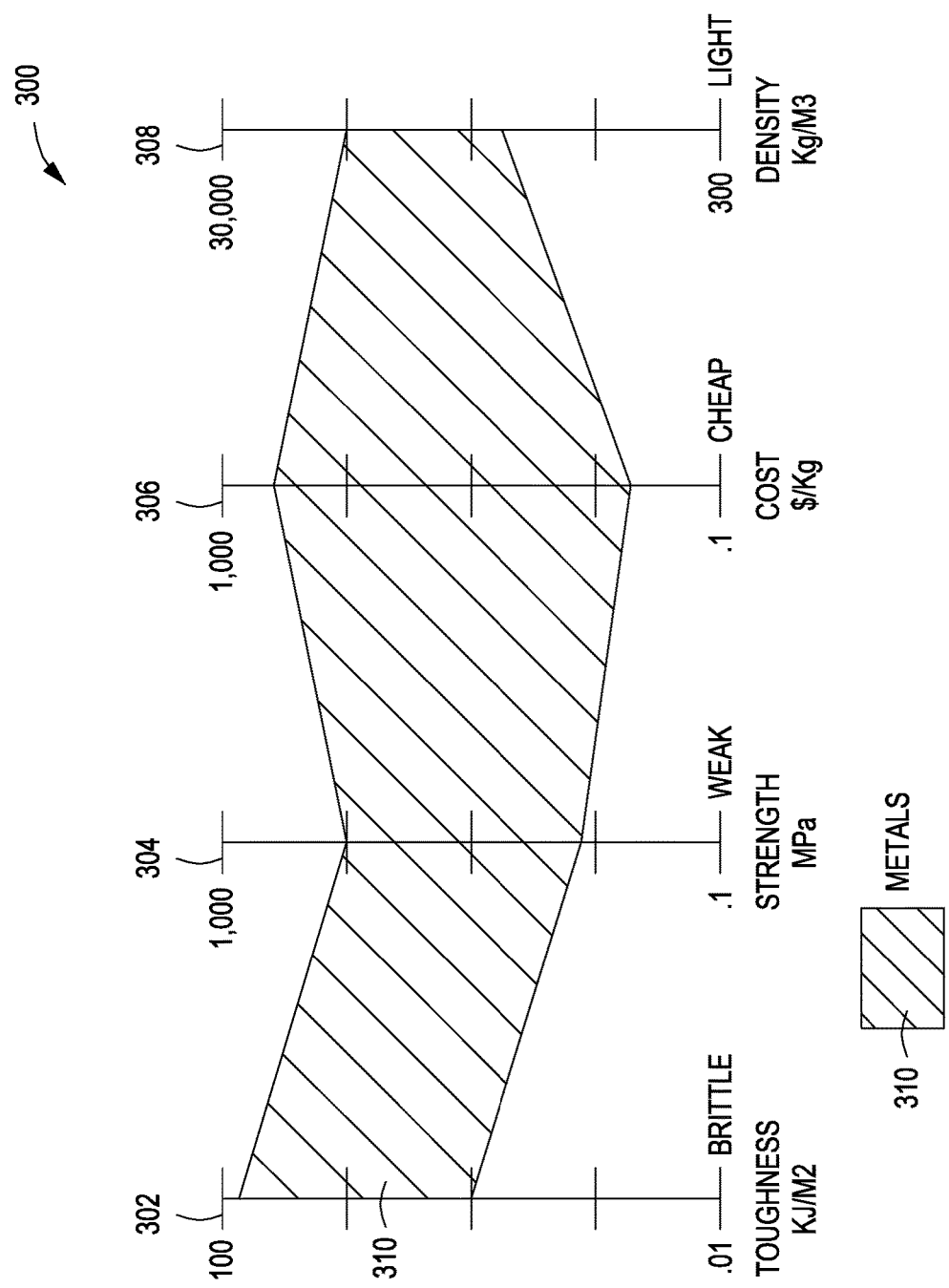
FIGS. 3A-3C illustrate a parallel axis plot generated to display attributes of different types of materials associated with a spectrum of design options, according to various embodiments of the invention.
Figure 3B:
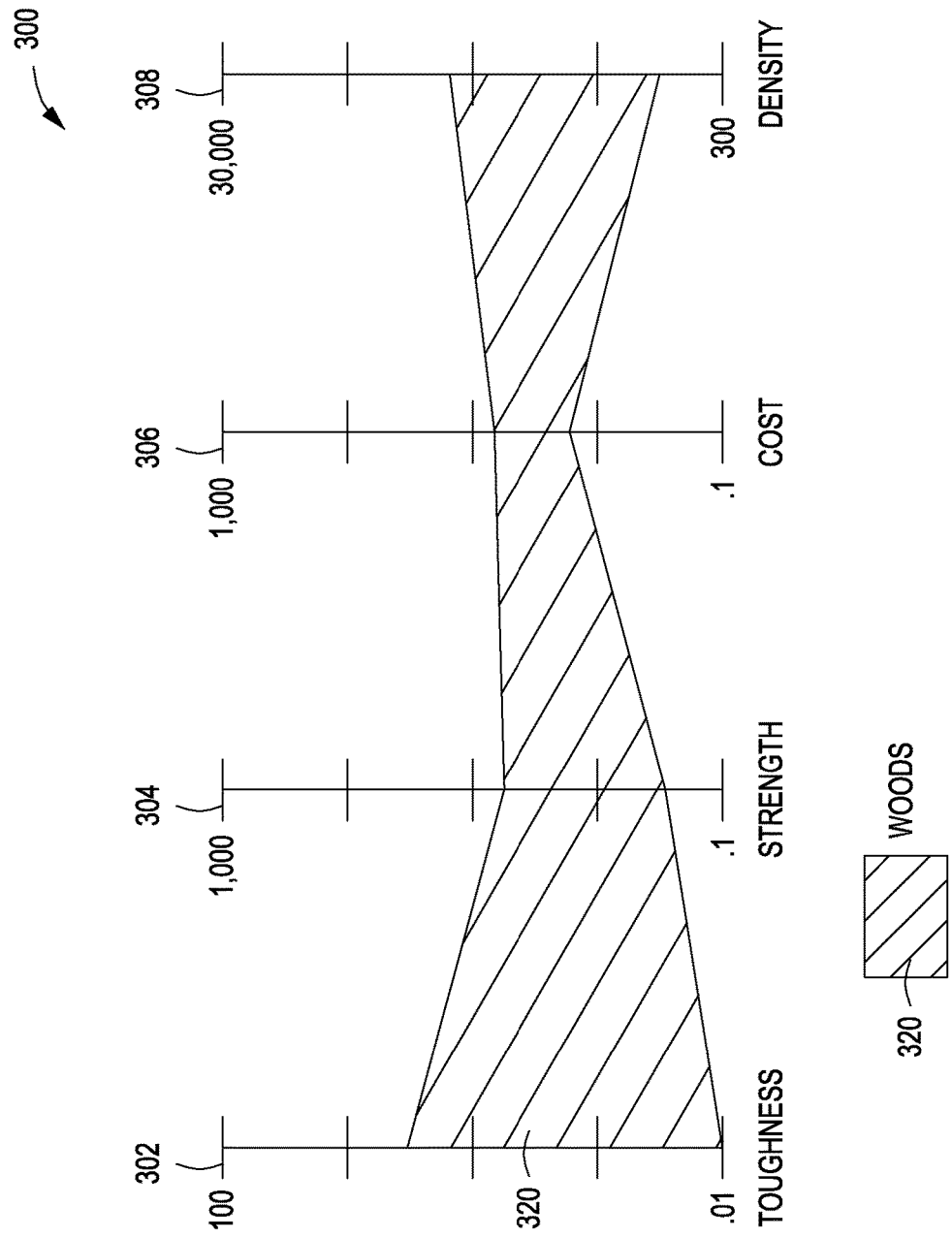
Figure 3C:
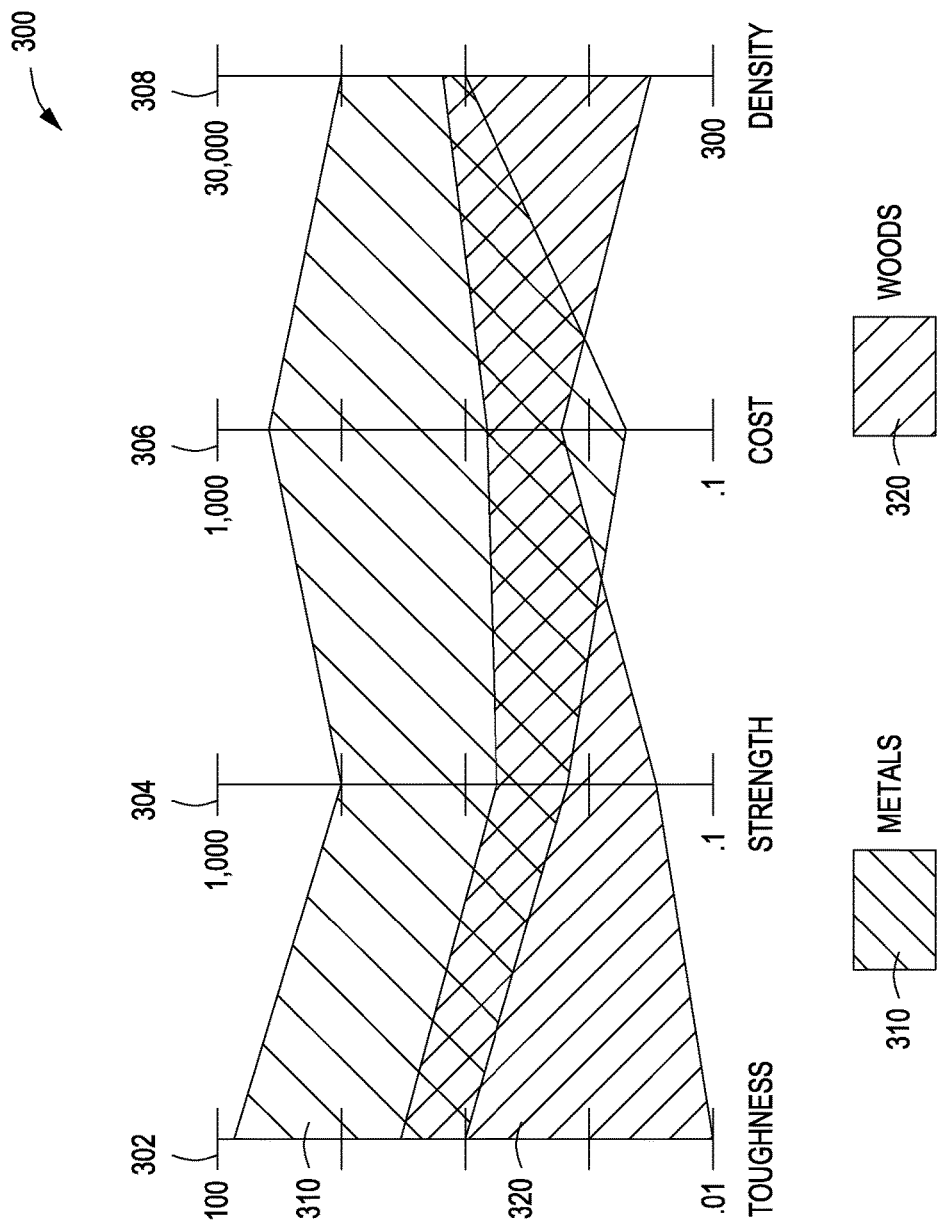

FIGS. 3A-3C illustrate a parallel axis plot generated to display attributes of different types of materials associated with a spectrum of design options, according to various embodiments of the invention. As shown in each of FIGS. 3A-3B, GUI 212 includes, without limitation, a parallel axis plot 300 that, in turn, includes axes 302, 304, 306, and 308. Each axis is associated with a different attribute of a design option 204 and/or a material associated with a design option 204. Plot 300 may include any number of different axes representing any different attribute. However, in the example discussed herein, axis 302 corresponds to a toughness attribute, axis 304 corresponds to a strength attribute, axis 306 corresponds to a cost attribute, and axis 308 corresponds to a density attribute. GUI engine 210 is configured to generate parallel axis plot 300 in order to facilitate streamlined comparison of design options 204 and associated materials.

As shown in FIG. 3A, plot 300 includes a design option envelope 310. Envelope 310 represents a range of different design options 204, where each design option 204 in envelope 310 is associated with a metal. Envelope 310 spans different ranges of the various axes of plot 300, indicating the ranges of those attributes corresponding to design options 204 associated with of a type of metal.

As shown in FIG. 3B, plot 300 now includes a design option envelope 320. Envelope 320 represents a range of different design options 204, where each design option 204 in envelope 320 is associated with a wood. Envelope 320 spans different ranges of the various axes of plot 300, indicating the ranges of those attributes corresponding to design options 204 associated with a type of wood.

As shown in FIG. 3C, plot 300 includes both envelope 310 and envelope 320. GUI engine 210 may display multiple design option envelopes in the fashion shown in FIG. 3C in order to allow end-users to compare design options 204 and the specific materials that may be used to construct real-world or simulated instances of those design options. When displaying multiple envelopes in the manner shown, GUI engine 210 may assign a different color, opacity, pattern, depth, or any other distinct visual attribute, or combination thereof, in order to visually distinguish those envelopes from one another. In one embodiment, GUI engine 210 computes an opacity value for each envelope based on at least one of the number of design options associated with the envelope, the degree to which the design options in the envelope meet the design criteria, and the ranges of attributes associated with the design options in the envelope.

Referring generally to FIGS. 3A-3C, GUI engine 210 may generate and display envelopes against axes of plot 300 using multiple different techniques according to various embodiments. In one embodiment, GUI engine 210 generates envelopes for specific design options 204 based on attributes of the materials associated with those specific design options. For example, GUI engine 210 could generate envelope 310 shown in FIGS. 3A and 3C based on attributes of metals that can potentially be used to generate feasible designs. For a given axis, the range of envelope 310 would indicate the range of attributes associated with different types of metals.

In another embodiment, GUI engine 210 generates envelopes for specific design options 204 based on attributes of those specific designs options. For example, GUI engine 210 could generate envelope 310 shown in FIGS. 3A and 3C based on attributes of individual design options 204 associated with metals. For a given axis, the range of envelope 310 would indicate the range of attributes associated with a simulated instance of a design option 204 composed of a metal.

By implementing the display techniques discussed herein, GUI engine 210 is capable of providing the end-user with a comprehensive display of the attributes of specific types of materials from which feasible designs may be constructed and/or attributes of specific design options 204.

Figure 4A:
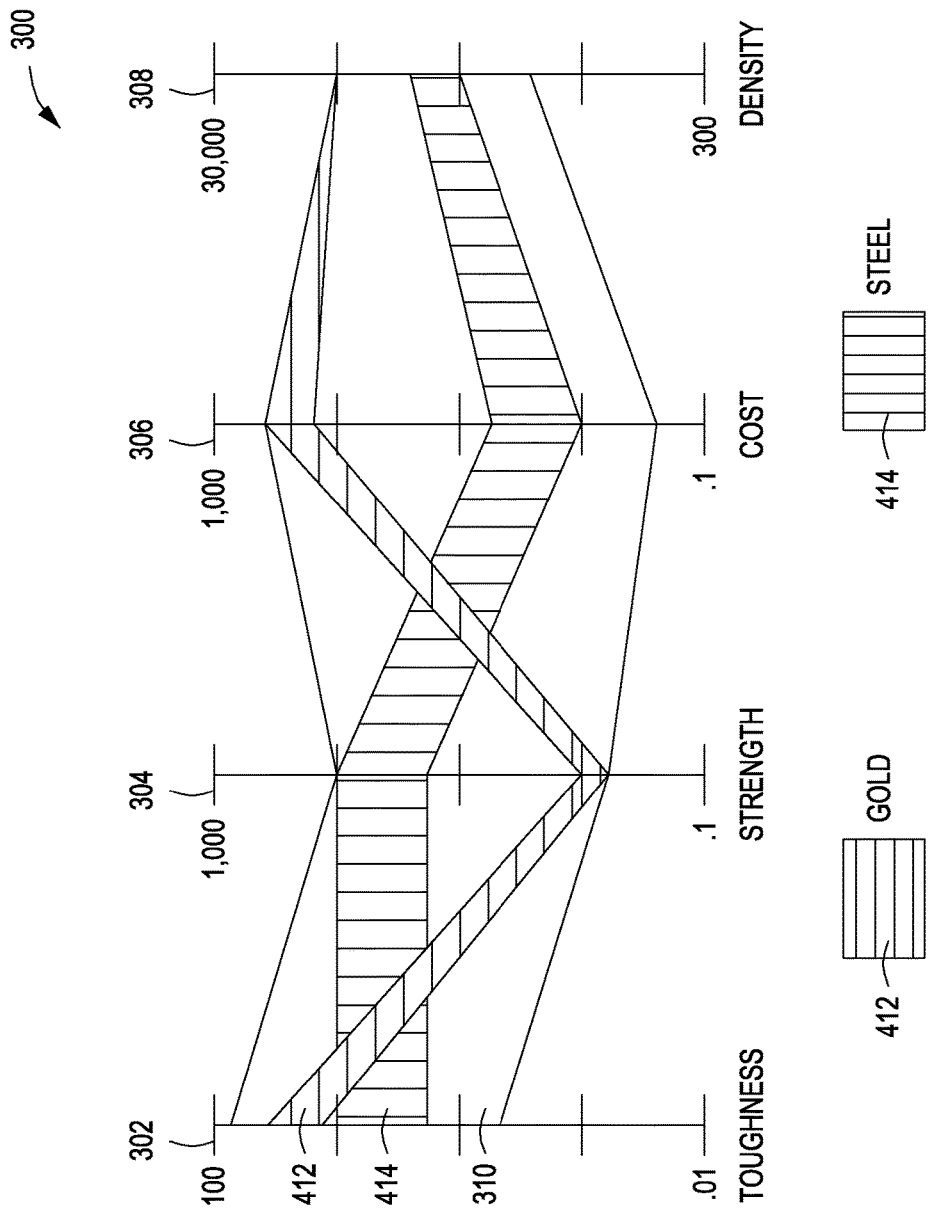
FIGS. 4A-4C illustrate the parallel axis plot of FIGS. 3A-3C generated to display attributes of specific materials associated with the spectrum of design options, according to various embodiments of the invention.
Figure 4B:
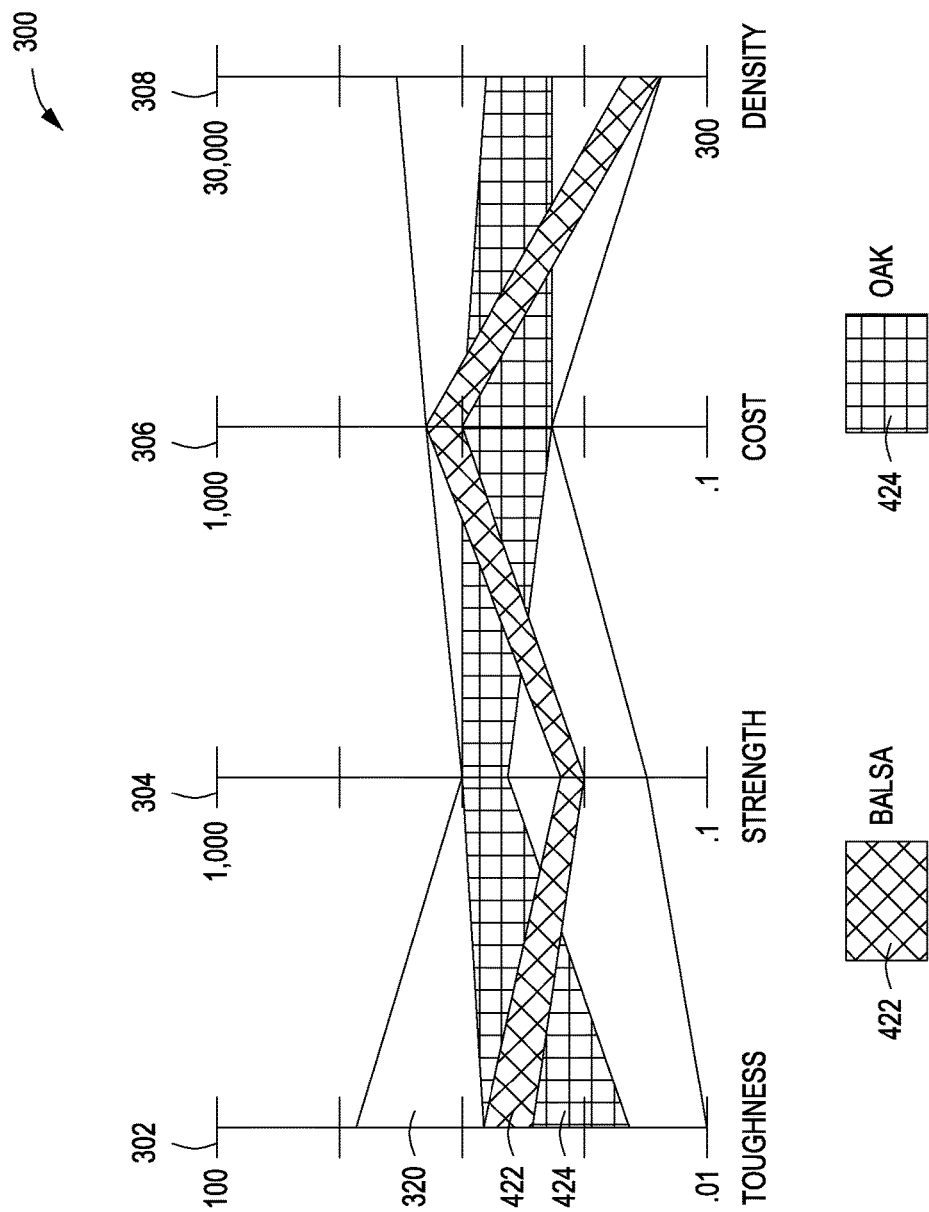
Figure 4C:
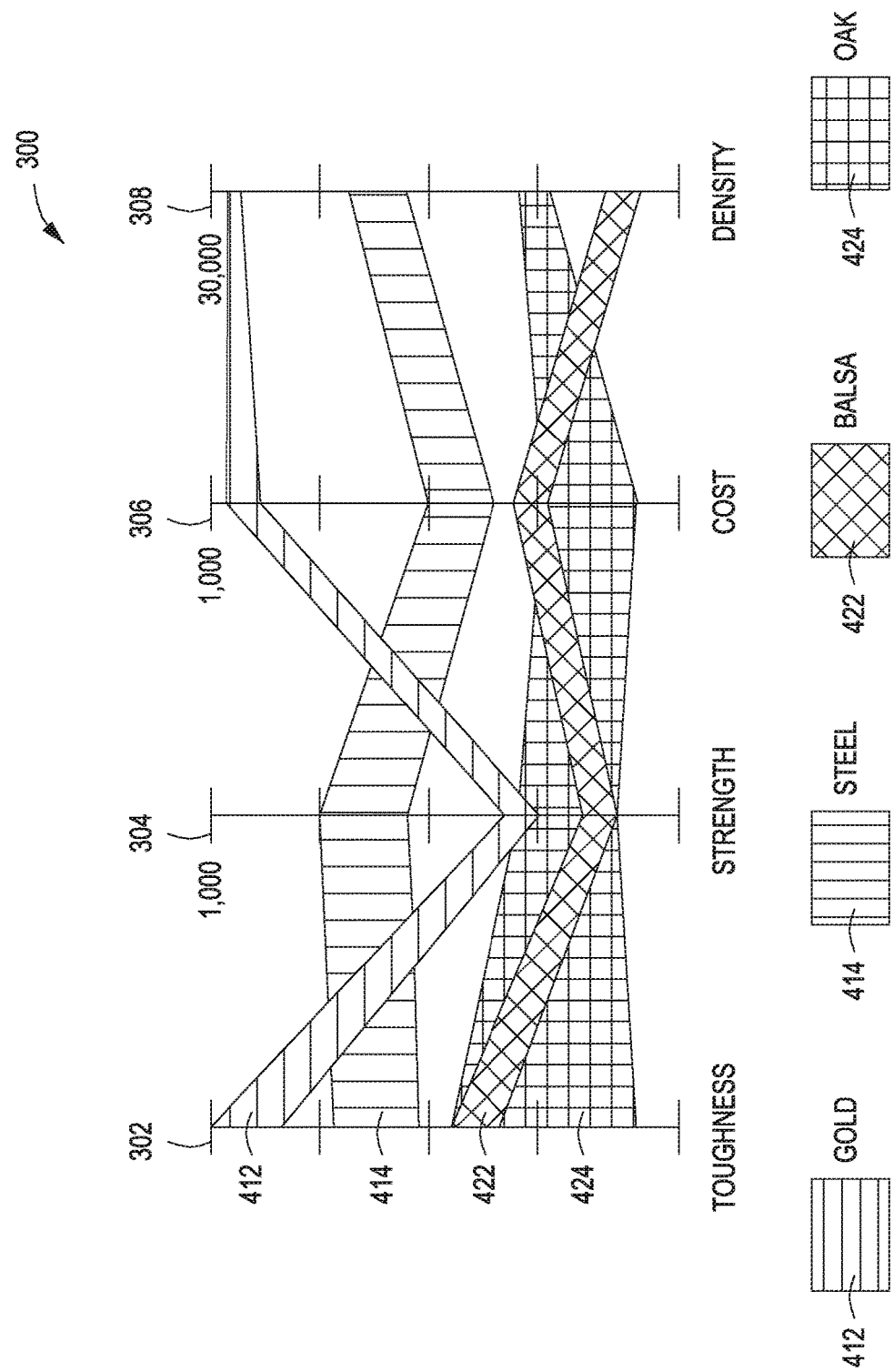

FIGS. 4A-4C illustrate the parallel axis plot of FIGS. 3A-3C generated to display attributes of specific materials associated with the spectrum of design options, according to various embodiments of the invention. As shown in FIG. 4A, envelope 310 includes band 412 and band 414. Band 412 represents design options 204 associated with gold. Band 414 represents design options associated with steel. Bands 412 and 414 reflect specific ranges of attributes of simulated design options 204 composed of gold and steel, respectively, as indicated by the axes of plot 300 corresponding to those attributes.

As shown in FIG. 4B, envelope 320 includes band 422 and band 424. Band 422 represents design options 204 associated with balsa. Band 424 represents design options associated with oak. Bands 422 and 424 reflect specific ranges of attributes of simulated design options 204 composed of balsa and oak, respectively, as indicated by the axes of plot 300 corresponding to those attributes.

As shown in FIG. 4C, plot 300 includes bands 412, 414, 422, and 424. GUI engine 210 may display multiple bands within design option envelopes in the fashion shown in FIG. 4C in order to allow end-users to compare design options 204 and the specific materials that may be used to construct real-world or simulated instances of those design options. When displaying multiple bands in the manner shown, GUI engine 210 may assign a different color, opacity, pattern, depth, or any other distinct visual attribute, or combination thereof, in order to visually distinguish those bands, and the associated envelopes, from one another. In one embodiment, GUI engine 210 computes an opacity value for each band based on at least one of the number of design options associated with the band, the degree to which the design options in the band meet the design criteria, and the ranges of attributes associated with the design options in the band.

Referring generally to FIGS. 4A-4C, the range of attributes indicated via bands 412, 414, 422, and 424 and axes 302, 304, 306, and 308 may correspond to particular bulk properties of materials that can be used to construct design options 204. For example, in FIGS. 4A and 4C, because band 412 crosses cost axis 306 near the top of that axis, band 412 would indicate that an instance of design options 204 composed of gold would be costly. Alternatively, the range of attributes indicated via the aforementioned bands and axes may correspond to properties of specific design options. For example, the range of band 412 across axis 306 could indicate a range of manufacturing costs associated with specific design options 204 composed of gold.

Figure 5:
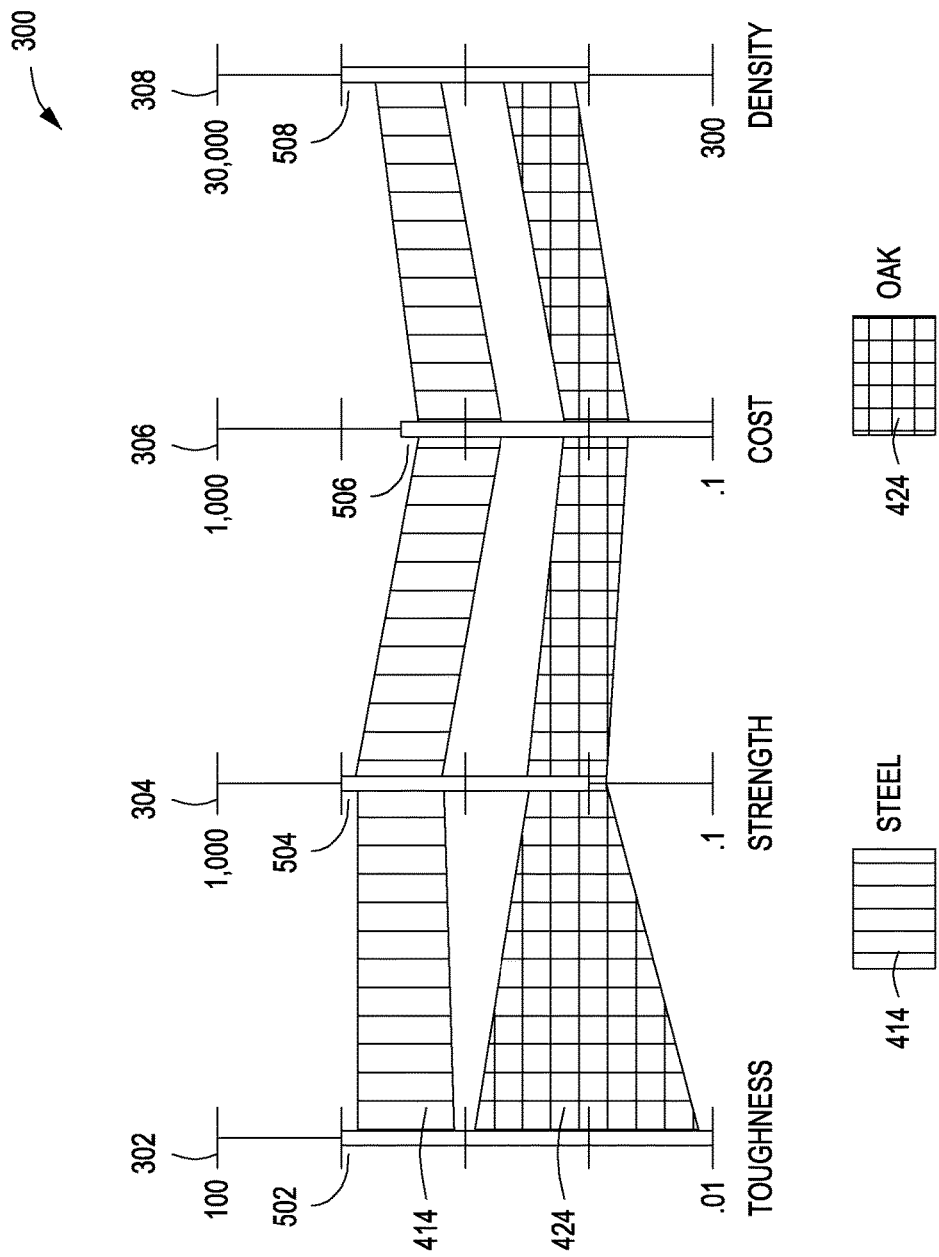
FIG. 5 illustrates how the specific materials designated in FIGS. 3A-4C can be constrained based on attribute filter settings, according to various embodiments of the invention.

FIG. 5 illustrates how the specific materials designated in FIGS. 3A-4C can be constrained based on attribute filter settings, according to various embodiments of the invention. As shown, plot 300 now includes attributes filters 502, 504, 506, and 508 positioned on axes 302, 304, 306, and 308, respectively. The end-user may adjust the various attribute filters shown in order to limit the display of envelopes, bands, or specific design options to only those having attributes falling within certain ranges. For example, attribute filter 506 is set to limit the display of design options 204 associated with excessive cost. Thus, design options 204 associated with gold and residing within band 412 are no longer displayed. Similarly, attribute filter 508 is set to limit the display of design options 204 associated with low density. Accordingly, design options 204 associated with balsa and residing within band 422 are no longer displayed.

Figure 6A:
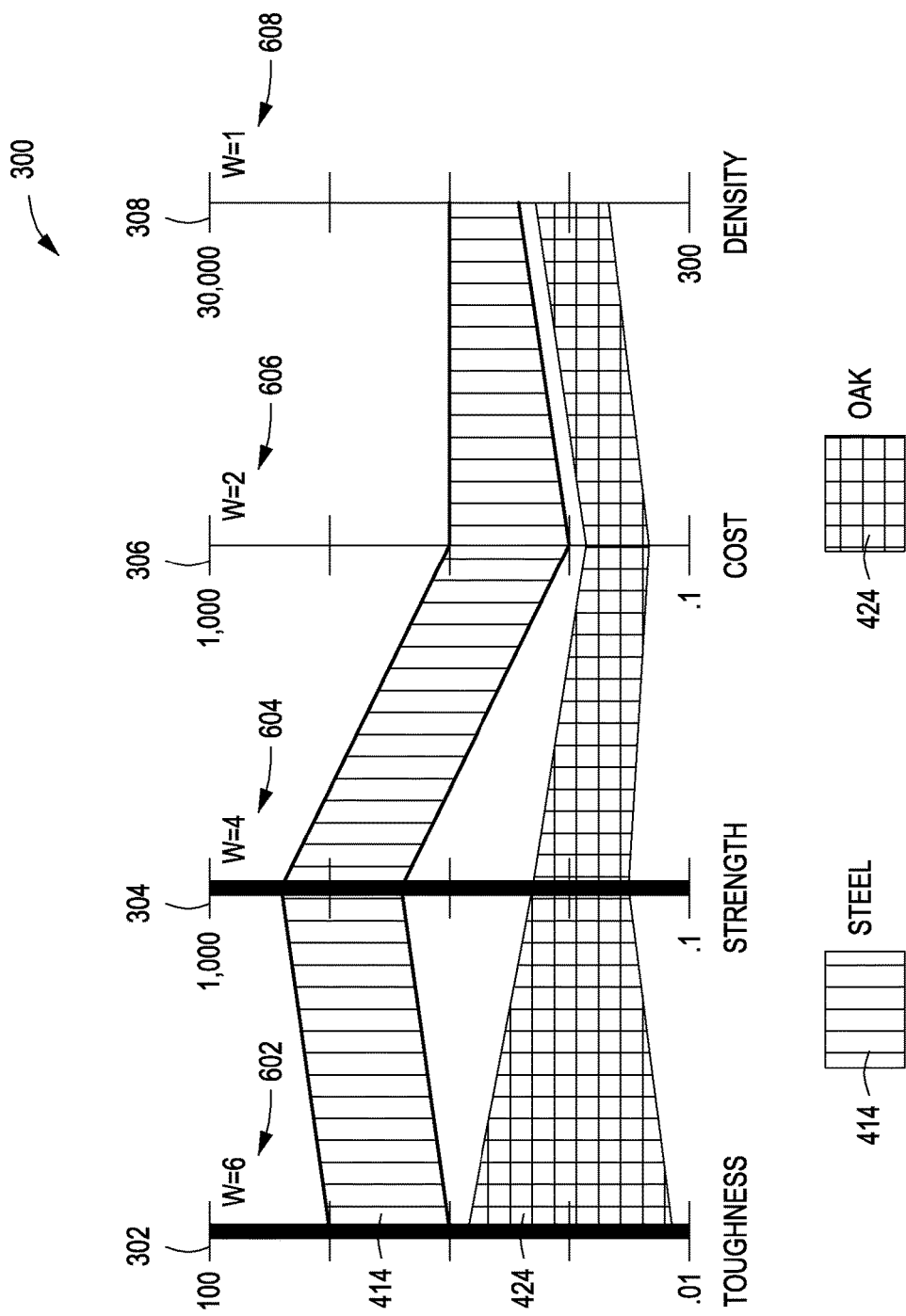
FIGS. 6A-6B illustrate how one or more design options can be identified based on attribute weight settings for certain materials designated in FIG. 5, according to various embodiments of the invention.
Figure 6B:
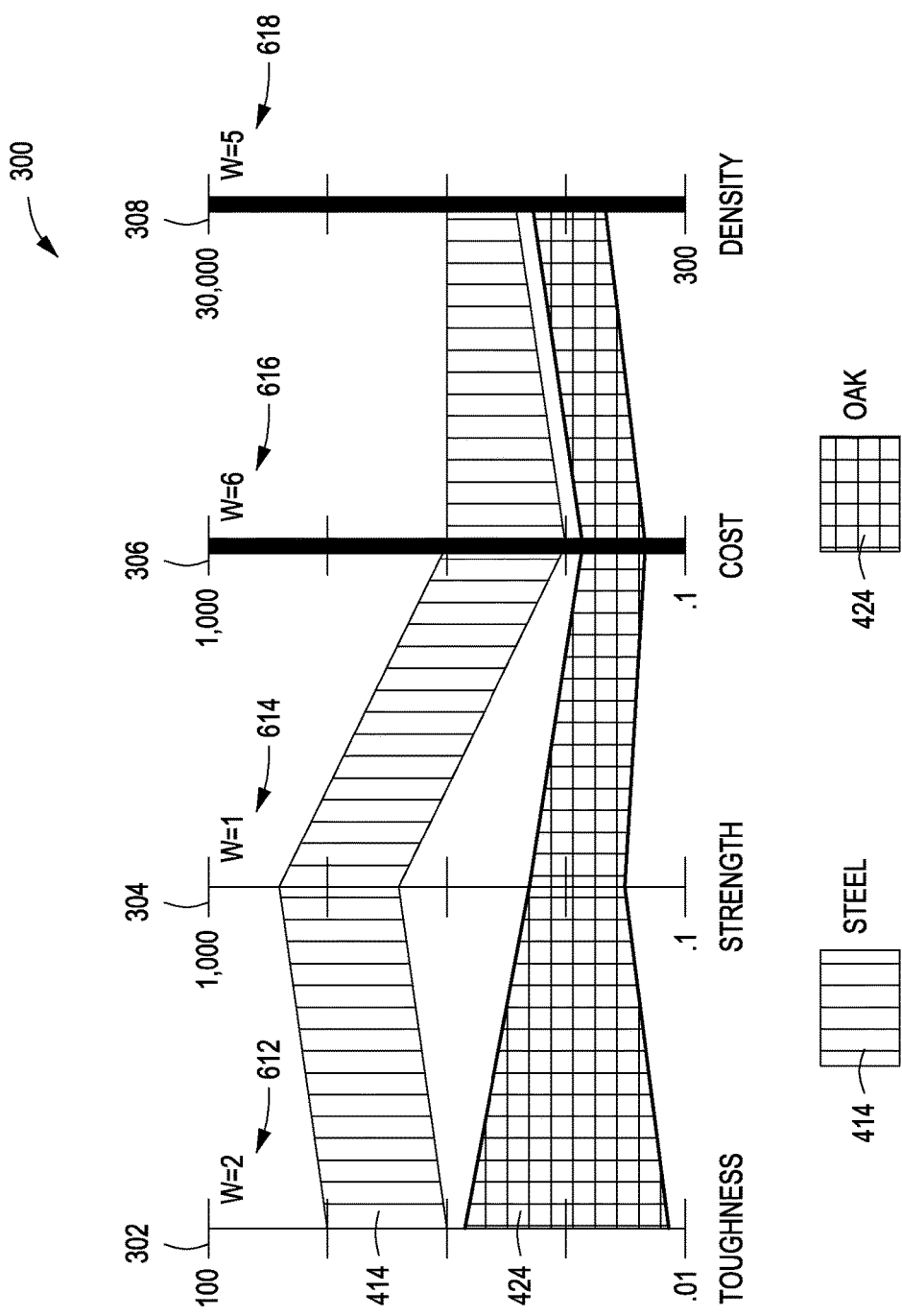

FIGS. 6A-6B illustrate how one or more design options can be identified based on attribute weight settings for certain materials designated in FIG. 5, according to various embodiments of the invention. As shown in FIG. 6A, plot 300 now includes weights 602, 604, 606, and 608 associated with axes 302, 304, 306, and 308, respectively. The weight value for each axis corresponds to the attribute associated with that axis. In the example shown in FIG. 6A, the toughness attribute has a weight value of 6, the strength attribute has a weight value of 4, the cost attribute has a weight value of 2, and the density attribute has a weight value of 1. GUI engine 210 uses these weight values to compute an attribute score for each attribute of each design option 204. GUI engine 210 then combines the various attribute scores, for each design option 204, to generate a design score. GUI engine 210 ranks the different design options 204 based on the corresponding design scores in order to assist the end-user with selecting a design option 204 associated with a particular material.

In computing the attribute score for a given attribute of a given design option 204, GUI engine 210 determines how closely the design option meets a target attribute value. For example, GUI engine 210 could determine, for a design option within envelope 414, that the design option falls within 100 $/kg of a given cost target. GUI engine 210 would then assign an attribute score for the cost attribute for that design option.

GUI engine 210 computes attribute scores for each design option 204 and each attribute. Then, GUI engine 210 weights each attribute score based on the weight value associated with the corresponding attribute, and combines the weighted attribute scores to generate a design score for each design option 204. GUI engine 210 then ranks the various design options and selects an envelope of design options, or specific design option, having the best score.

In the example shown in FIG. 6A, toughness and strength are more heavily weighted than cost or density. The target values for these attributes (not shown) fall on the higher side of the respective axes. Design options within envelope 414, which are composed of steel, meet these targets values more readily than do design options within envelope 424. Thus, GUI engine 210 identifies the material(s) associated with envelope 414 as being optimal. The material selected as optimal depends on the particular weight values selected by the end-user. Thus, different weight values may cause GUI engine 210 to identify different materials as optimal, as described below.

In FIG. 6B, the toughness attribute now has a weight value of 2, the strength attribute now has a weight value of 1, the cost attribute now has a weight value of 6, and the density attribute now has a weight value of 5. The target values for these attributes (not shown) fall on the lower side of the respective axes. Because cost and density are more heavily weighted than toughness or strength, design options within envelope 424, which are composed of oak, meet the target values for these attributes more readily than do design options within envelope 414. Thus, GUI engine 210 identifies the material(s) associated with envelope 424 as being optimal.

Figure 7:
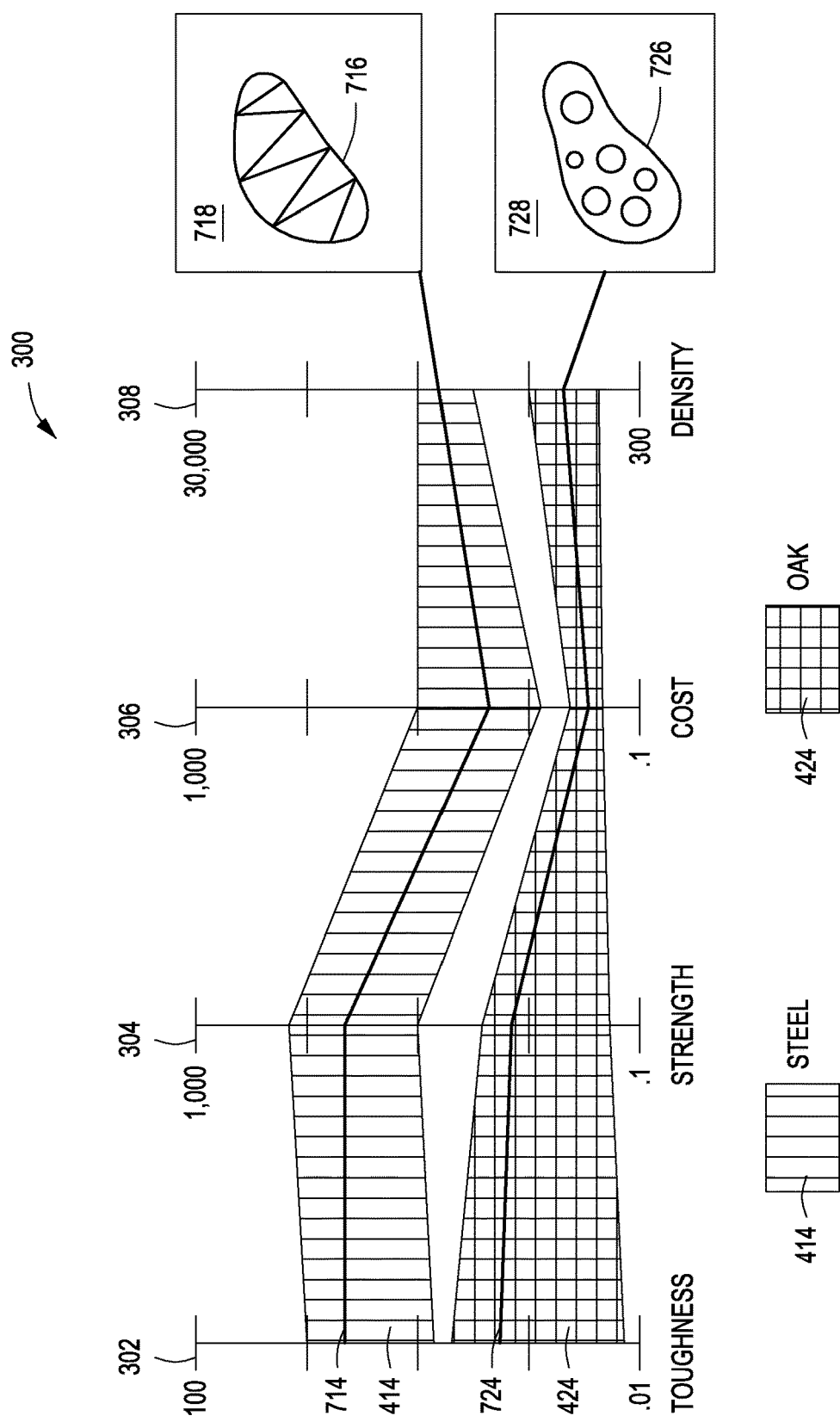
FIG. 7 illustrates individual design options composed of the specific materials designated in FIGS. 6A-6B, according to various embodiments of the invention.

FIG. 7 illustrates individual design options composed of the specific materials designated in FIGS. 6A-6B, according to various embodiments of the invention. As shown, envelope 414 includes a design option 714 that is depicted by a design snapshot 716 within a window 718. Similarly, envelope 424 includes a design option 724 that is depicted by a design snapshot 726 within a window 728. The end-user may select the particular design options 714 and 724 shown, and, in response, GUI engine 210 then displays windows 718 and 728, respectively, showing design snapshots 716 and 726, respectively. Thus, GUI engine 210 provides end-users with the ability to preview design options associated with particular materials while evaluating the various tradeoffs afforded by those materials.

As a general matter, GUI engine 210 may display design options 204 on parallel axis plot 300 using any combination of different axes corresponding to any technically feasible variety of material attribute. A given material attribute may reflect bulk properties of a particular material, or may reflect simulated properties of a material when used in a simulation of a design option. In addition, GUI engine 210 may pre-filter design options 204, prior to placement on parallel axis plot 300, to eliminate design options that fail to meet some end-user specific criteria. The criteria could reflect manufacture times, ease of material acquisition, cost of material, fabrication times for specific design options, and so forth. With this technique, end-users can selectively view only the design options that can feasibly be selected.

Figure 8:
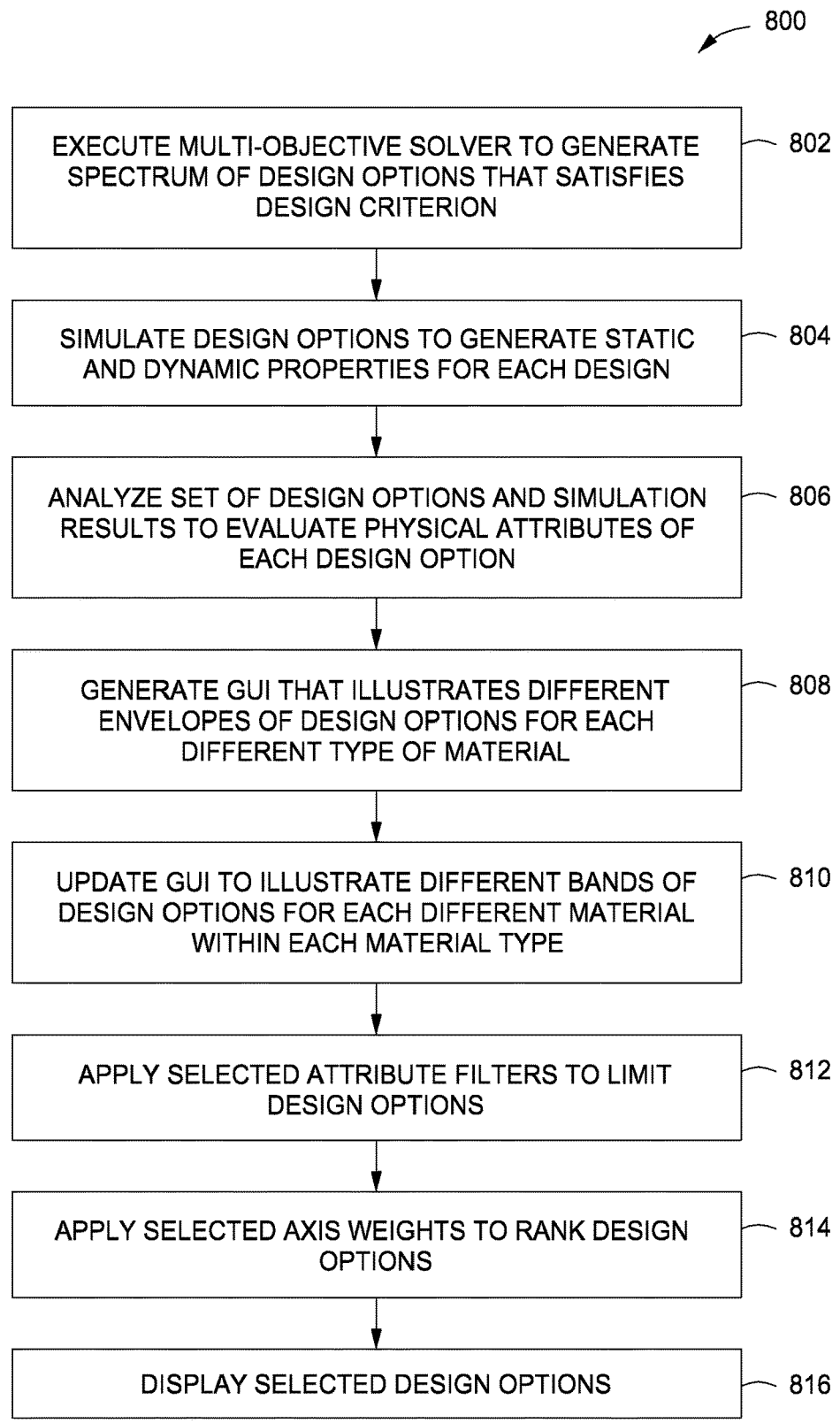
FIG. 8 is a flow diagram of method steps for generating a parallel axis plot for comparing materials associated with different design options, according to various embodiments of the invention.
Figures 11C, 11D:
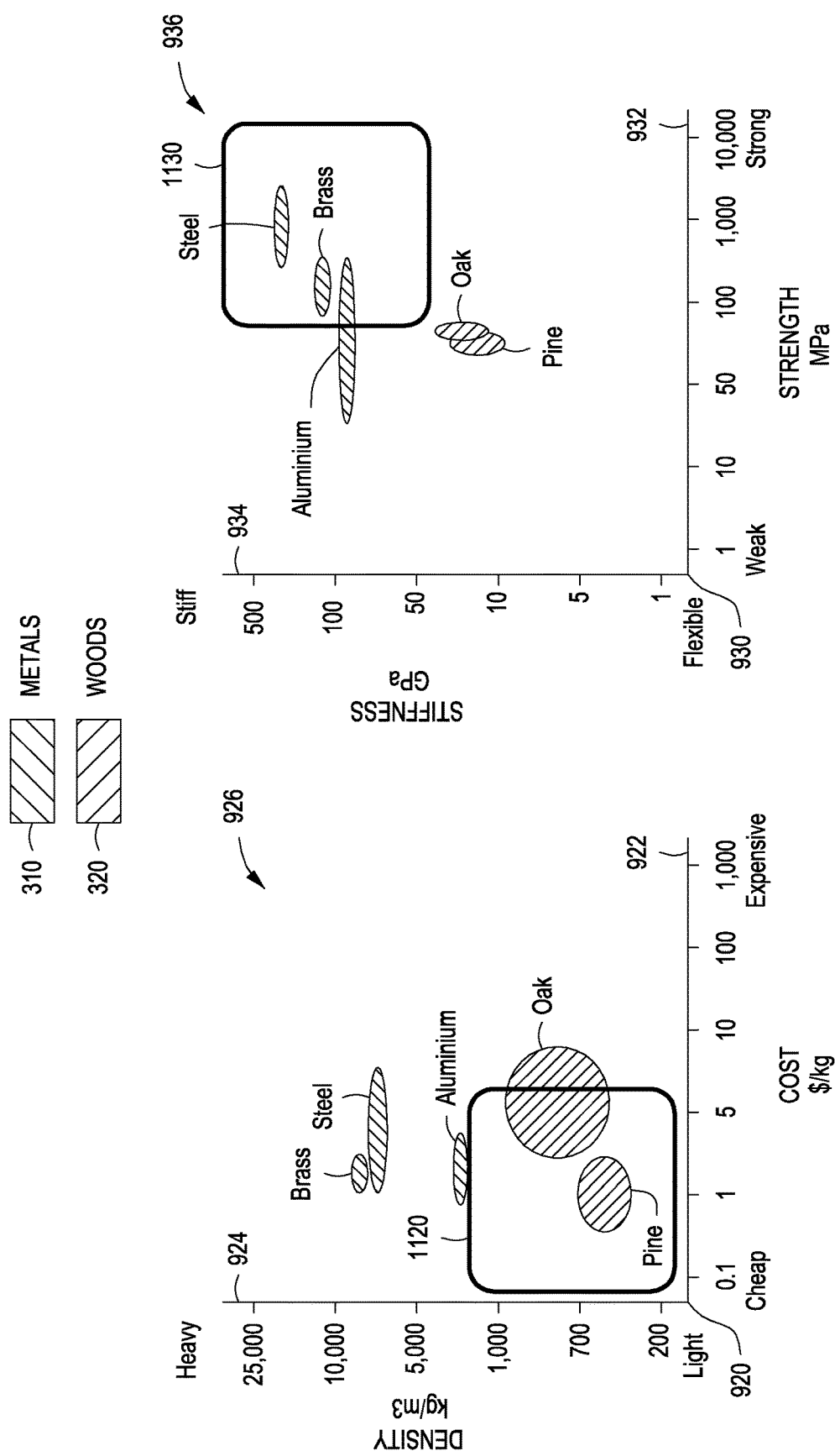
Figures 12C, 12D:
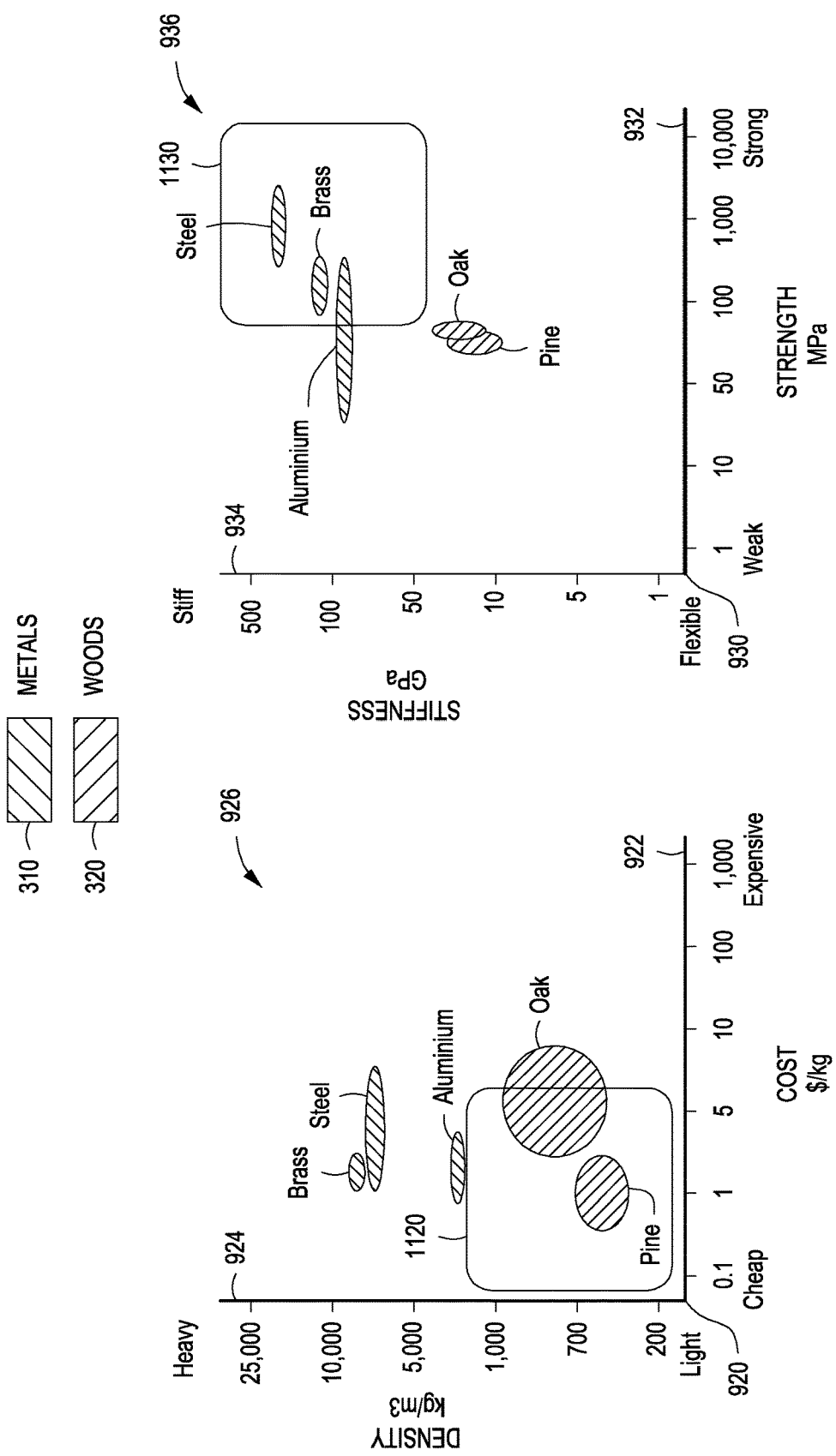
Figures 13E, 13F:
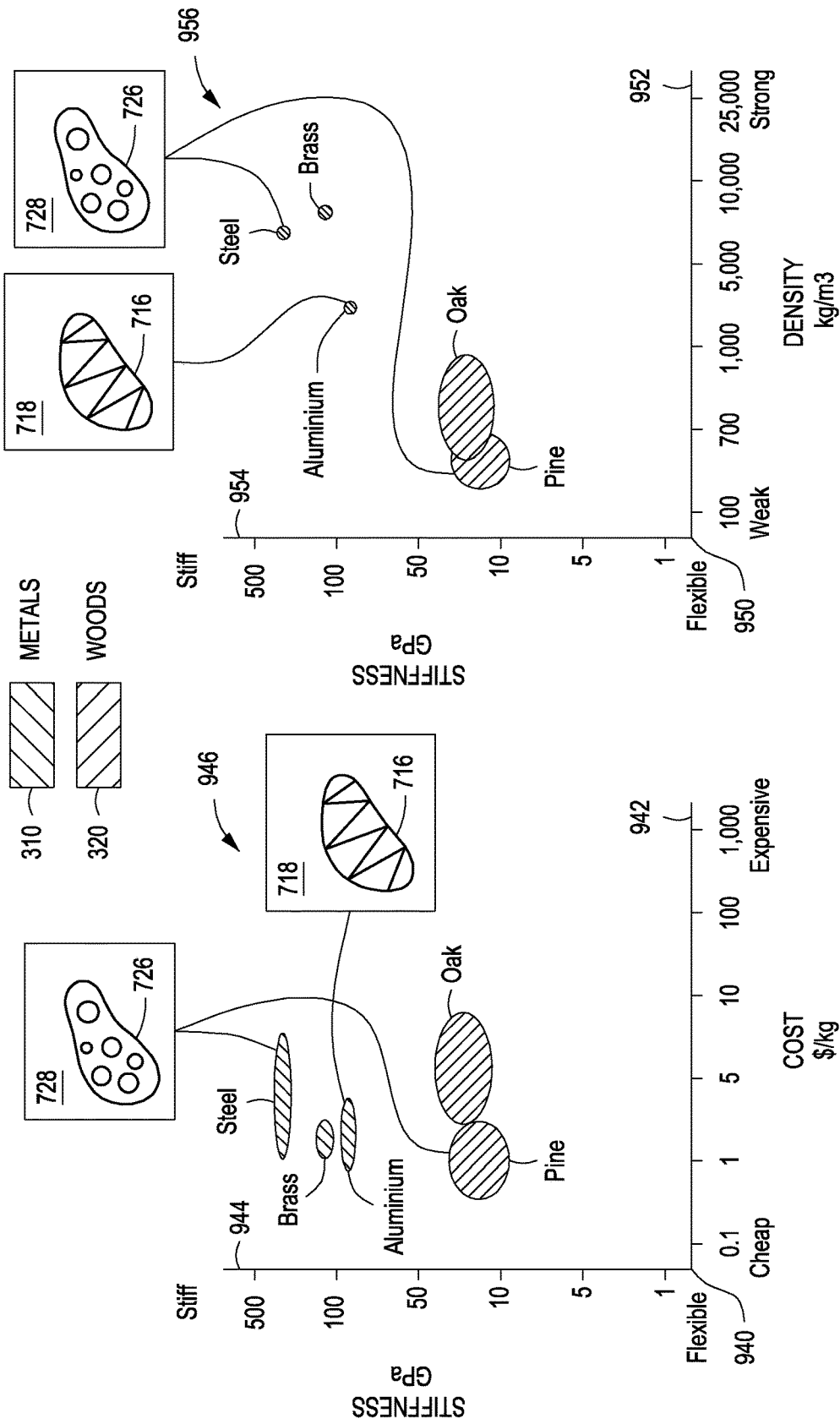

Persons skilled in the art will recognize that the screenshots of GUI 212 shown in FIGS. 3A-7 are provided for exemplary purposes only to illustrate the operation of GUI engine 210. FIG. 8, described below, sets forth the general operative characteristics of GUI engine 210 in stepwise fashion.

FIG. 8 is a flow diagram of method steps for generating a parallel axis plot for comparing materials associated with different design options, according to various embodiments of the invention. Although the method steps are described in conjunction with the systems of FIGS. 1-7, persons skilled in the art will understand that any system configured to perform the method steps, in any order, is within the scope of the present invention.

As shown, a method 800 begins at step 802, where design engine 200 executes a multi-objective solver to generate a spectrum of design options that potentially satisfy design criteria. In doing so, design engine 200 receives data that defines a design problem to be solved by some potential design. The design problem data establishes bounding geometry associated with the design problem, specifies various positions where loads must be balanced, indicates positions where loads are applied to the bounding geometry, and designates positions where obstacles preclude the placement of geometry. Design engine 200 executes the multi-objective solver based on this information to generate design options 204, where each design option 204 is composed of one of the materials defined in materials data 202. The multi-objective solver could be, for example, a design optimization algorithm, a topology optimization algorithm, a genetic algorithm, and so forth. Each design option 204 generated in this fashion includes specific 3D geometry that, when fabricated with the associated material, potentially solves the design problem.

At step 804, simulation engine 206 simulates design options 204 to generate static and dynamic properties for each such design option. Simulation engine 206 could execute a finite element analysis (FEM) solver, among other possibilities, in order to determine static and dynamic properties of a given design option 204. Simulation engine 206 may rely on the design problem input mentioned above in order to construct a simulated environment for testing each design option 204. For each such option, simulation engine 206 generates simulation results 208. Simulation results 208 include various attributes and properties associated with each design option 204. For a given design option 204, those properties could include, for example, mass, density, volume, cost, maximum stress, and so forth.

At step 806, GUI engine 210 analyzes design options 204 and simulation results 208 generated at step 804 to determine physical attributes of each design instance. For a given design option 204, GUI engine 210 also obtains materials data 202 associated with that design option 204.

At step 808, GUI engine 210 generates GUI 212 that illustrates different bands of design options for each different type of material associated with those design options. For example, GUI 212 could include parallel axis plot 300 shown in FIGS. 3A-3C. In this example, parallel axis plot 300 would include different design options bands for metals and woods.

At step 810, GUI engine 210 updates GUI 212 to illustrate different bands of design options for each specific material associated with design options 204. For example, GUI 212 could include parallel axis plot 300 shown in FIGS. 4A-4C. In this example, parallel axis plot 300 would include different design options bands for specific metals and for specific woods.

At step 812, GUI engine 210 applies attribute filters selected by an end-user to the axes of parallel axes plot 300, thereby constraining the design options shown to those falling within certain regions. GUI engine 210 may thus provide end-users with the ability to rule out design options composed of certain materials when those materials have attributes that fall outside of the filtered ranges.

At step 814, GUI engine 210 applies attribute weights to selected attributes based on end-user input in order to rank design options 204. GUI engine 210 may apply any particular weight to any attribute, including, but not limited to, those shown on parallel axis plot 310. Then, GUI engine 210 may compute a score for each design option 204 based on the attribute values for each such design option and the corresponding attribute weight. GUI engine 210 may then rank the design options 204 based on the computed scores. At step 816, GUI engine 210 displays design options associated with a selected design vector. GUI engine 210 may also rely on simulation results 208 in order to illustrate various properties of a selected design.

By implementing the method 800, GUI engine 210 is capable of displaying highly dense amounts of information within parallel axis plot 300. This plot potentially allows the end-user to quickly assess various tradeoffs associated with each design option and with each material used to generate the various design options. GUI engine 210 is also configured to generate collections of plots to further illustrate attributes associated with the materials from which design options 204 may be composed, as described in greater detail below in conjunction with FIGS. 9-14.

Small Multiple Plot for Material Comparison

FIGS. 9A-F illustrates a collection of plots, where each plot illustrates two material attributes associated with the spectrum of design options plotted against one another, according to various embodiments of the invention. As shown, GUI 212 includes, without limitation, plots 900, 910, 920, 930, 940, and 950, each of which includes different regions of materials. Each region of materials generally corresponds to a subset of design options associated with a specific material or material type, in this example, either a metal or a wood. Thus, the regions shown in FIGS. 9A-F are analogous to the envelopes shown in FIGS. 3A-8.

Each plot includes X and Y axes that correspond to different pairs of material attributes. Plot 900 includes X-axis 902 corresponding to a strength attribute and Y-axis 904 corresponding to a cost attribute. Plot 900 includes different regions 906 of materials associated with a subset of design options, plotted according to the respective strength and cost attribute values. Plot 910 includes X-axis 912 corresponding to a strength attribute and Y-axis 914 corresponding to a density attribute. Plot 910 includes different regions 916 of materials associated with a subset of design options, plotted according to the respective strength and density attribute values. Plot 920 includes X-axis 922 corresponding to a cost attribute and Y-axis 924 corresponding to a density attribute. Plot 920 includes different regions 926 of materials associated with a subset of design options, plotted according to the respective cost and density attribute values. Plot 930 includes X-axis 932 corresponding to a strength attribute and Y-axis 934 corresponding to a stiffness attribute. Plot 930 includes different regions 936 of materials associated with a subset of design options, plotted according to the respective strength and stiffness attribute values. Plot 940 includes X-axis 942 corresponding to a cost attribute and Y-axis 944 corresponding to a stiffness attribute. Plot 940 includes different regions 946 of materials associated with a subset of design options, plotted according to the respective cost and stiffness attribute values. Plot 950 includes X-axis 952 corresponding to a density attribute and Y-axis 954 corresponding to a stiffness attribute. Plot 950 includes different regions 956 of materials associated with a subset of design options, plotted according to the respective density and stiffness attribute values.

The specific regions of materials shown in each plot generally correspond to design options within the spectrum of design options. Thus, in situations where no design options are associated with a particular material, that material will not appear in the collection of plots. In addition, each region of materials may be shaded with a specific opacity or other visual attribute that distinguishes those regions from one another. In one embodiment, GUI engine 210 computes an opacity value for each region based on at least one of the number of design options associated with the region, the degree to which the design options in the region meet the design criteria, and the ranges of attributes associated with the design options in the region.

FIGS. 10A-F illustrates limiting regions projected onto the collection of plots of FIGS. 9A-F, according to various embodiments of the invention. As shown, each of plots 900, 910, 920, 930, 940, and 950 includes a limiting region that eliminates certain materials from consideration. Plot 900 includes limiting region 1000, plot 910 includes limiting region 1010, plot 930 includes limiting region 1030, plot 940 includes limiting region 1040, and plot 950 includes limiting region 1050. GUI engine 210 establishes the limiting region for a given plot based on individual attribute limits set for the respective axes of the plot. Those limits could be derived, for example, from the attribute filter settings discussed above in conjunction with FIG. 5. When a particular material or type of material falls outside of any limiting region of any plot, GUI engine 210 removes that material from consideration for all plots. For the remaining materials, GUI engine 210 then identifies fitness boundaries within each plot.

FIGS. 11A-F illustrates fitness boundaries proximate to materials that meet design criteria, according to various embodiments of the invention. As shown, each of plots 900, 910, 920, 930, 940, and 950 includes a fitness boundary. Plot 900 includes fitness boundary 1100, plot 910 includes fitness boundary 1110, plot 930 includes fitness boundary 1130, plot 940 includes fitness boundary 1140, and plot 950 includes fitness boundary 1150. A given fitness boundary represents a region or quadrant of the respective plot associated with attribute values that best meet the design criteria. For example, if the design criteria indicated strength should be maximized while cost minimized, then GUI engine 210 would generate fitness boundary 1110 within plot 900 to include materials having the lowest cost and highest strength. Likewise, if the design criteria indicated that density should be minimized while flexibility should be maximized, then GUI engine 210 would generate fitness boundary 1150 within plot 950 to include materials having the lowest density and highest stiffness.

As is shown, certain materials fall within, or close to, the fitness boundaries of the various plots more often than others. In the example shown in FIGS. 11A-F, brass and steel both fall within or partially within fitness boundaries 1100, 1120, 1130, and 1140. GUI engine 210 is configured to identify materials that reside within the highest number of fitness boundaries, and to then emphasize those fitness boundaries where the identified materials reside. Thus, in the example shown in FIGS. 11A-F, fitness boundaries 1100, 1120, 1130, and 1140 are emphasized. This approach may assist the end-user with identifying materials that best meet the design criteria. The emphasis displayed on the fitness boundaries of FIGS. 11A-F may also be adjusted based on material attribute weighting, as discussed below in conjunction with FIGS. 12A-F.

FIGS. 12A-F illustrates the plots in FIGS. 9A-F with material attribute weightings, according to various embodiments of the invention. As shown, the axes of plots 900, 910, 920, 930, 940, and 950 are emphasized to show different weight values. These different weight values may reflect the importance of the corresponding attributes when determining material fitness. In the example shown, strength and cost are most heavily weighted. GUI engine 210 is configured to emphasize the fitness boundaries for each plot based on the material attribute weights associated with those plots. Thus, since strength and cost are most heavily weighted, fitness boundary 1100 is most visibly emphasized. The other fitness boundaries may be emphasized as well, based on the different weightings associated with the axes of the pots where those boundaries reside.

FIGS. 13A-F illustrates individual design options having optimal weighted fitness, according to various embodiments of the invention. As shown, GUI 212 includes specific design options selected from within plots 900, 910, 920, 930, 940, and 950. In particular, design window 718 depicts design snapshot 716, indicating that the associated design option better meets the design criteria compared to other design options. Design window 728 is also shown depicting design snapshot 726, indicating that the associated design option also meets the design criteria.

Referring generally to FIGS. 9-13, the techniques described in conjunction with these figures may be applied separately or in conjunction with the approaches discussed in conjunction with FIGS. 3A-8. Persons skilled in the art will recognize that the specific examples set forth in FIGS. 9-13 are meant for illustrative purposes only, and are not meant to be limiting. The techniques described thus far are also set forth in stepwise fashion below in conjunction with FIG. 14.

Figure 14:
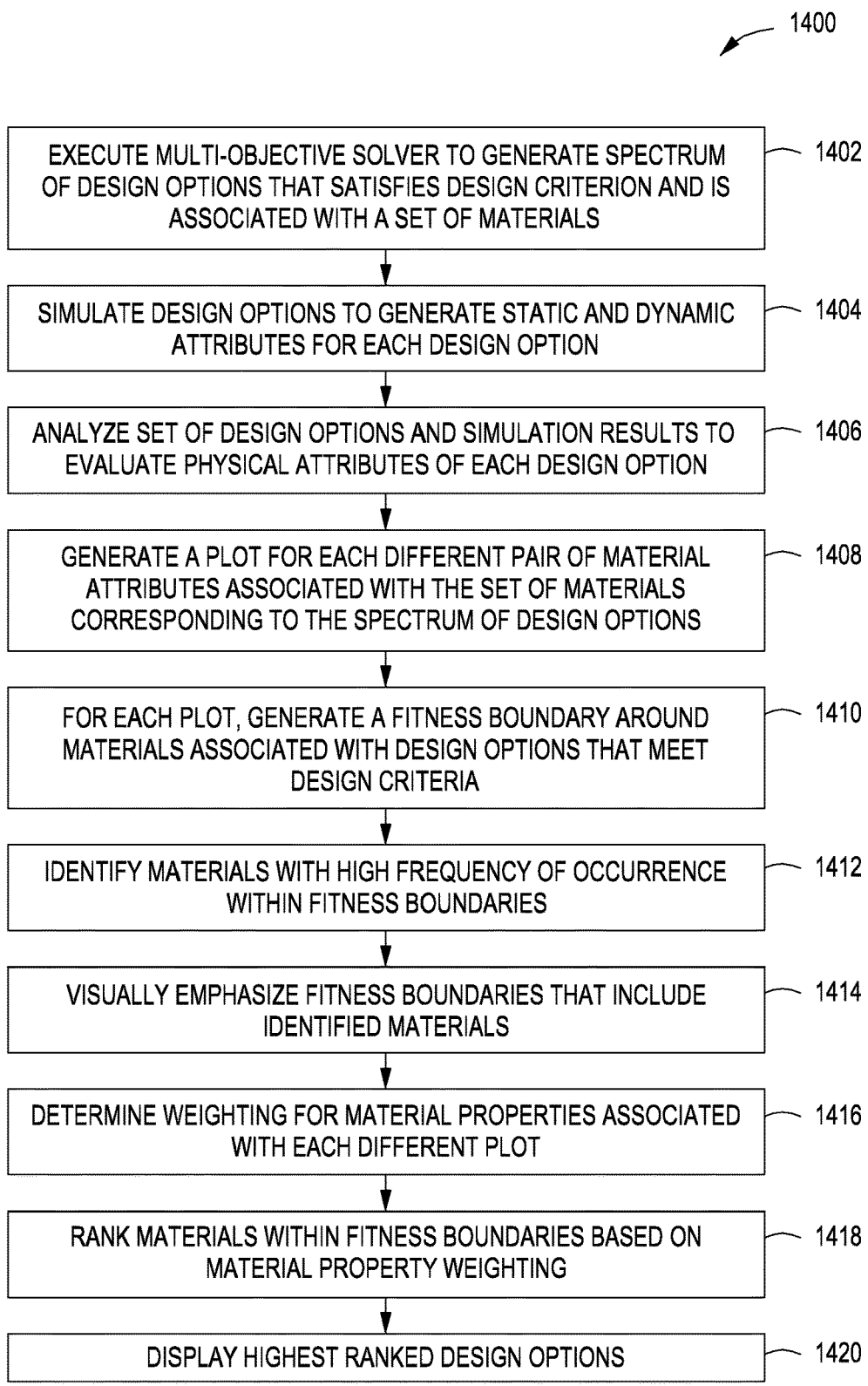
FIG. 14 is a flow diagram of method steps for identifying a material that meets a set of design criteria, according to various embodiments of the invention.

FIG. 14 is a flow diagram of method steps for identifying a material that meets a set of design criteria, according to various embodiments of the invention. Although the method steps are described in conjunction with the systems of FIGS. 1-7 and 9-13, persons skilled in the art will understand that any system configured to perform the method steps, in any order, is within the scope of the present invention.

As shown, a method 1400 begins at step 1402, where design engine 200 executes a multi-objective solver to generate a spectrum of design options that potentially satisfy design criteria. Step 1402 is substantially similar to step 802 of the method 800. At step 1404, simulation engine 206 simulates design options 204 to generate static and dynamic properties for each such design option. Step 1404 is substantially similar to step 804 of the method 800. At step 1406, GUI engine 210 analyzes design options 204 and simulation results 208 generated at step 1404 to determine physical attributes of each design instance. Step 1406 is substantially similar to step 806 of the method 800.

At step 1408, GUI engine 210 generates a plot for different pairs of material attributes associated with the spectrum of design options. GUI engine 210 could, for example, generate the collection of plots shown in FIGS. 9-13. The pairs of material attributes associated with the different plots generated at step 1408 may be determined based on problem specification 202. For example GUI engine 210 could evaluate problem specification 202 and determine specific material attributes relevant to meeting the design criteria. Then, GUI engine 210 could generate the collection of plots to include those relevant material attributes.

At step 1410, GUI engine 210 establishes limiting regions within one or more of the plots in the collection that constrain materials associated with the spectrum of design options based on material attribute values. The limiting regions established in this manner may cause certain materials to be eliminated. For example, if a given material was associated with a set of material attribute values that caused the material to be plotted, within any plot in the collection of plots, outside of a limiting region, then that material would be removed from consideration.

At step 1412, GUI engine 210 generates a fitness boundary for one or more plots indicating a region of the respective plot associated with material attribute values that best meet the design criteria. For example, if the design criteria indicated strength should be maximized while cost minimized, then GUI engine 210 would generate fitness boundary 1110 within plot 900 to include materials having the lowest cost and highest strength. Likewise, if the design criteria indicated that density should be minimized while flexibility should be maximized, then GUI engine 210 would generate fitness boundary 1150 within plot 950 to include materials having the lowest density and highest stiffness.

At step 1414, GUI engine 210 identifies specific materials that fall within fitness boundaries of the various plots more frequently than other materials. For example, in FIGS. 11A-F, brass and steel both fall within or partially within fitness boundaries 1100, 1120, 1130, and 1140. GUI engine 210 is configured to identify materials that reside within the highest number of fitness boundaries.

At step 1416, GUI engine 210 visually emphasizes the fitness boundaries where the identified materials reside. Thus, in the example shown in FIGS. 11A-F, fitness boundaries 1100, 1120, 1130, and 1140 are emphasized. This approach may assist the end-user with identifying materials that best meet the design criteria.

At step 1418, GUI engine 210 determines different weightings for material attributes associated with each different plot. These different weight values may reflect the importance of the corresponding attributes when determining material fitness. In the example shown in FIGS. 12A-F, strength and cost are most heavily weighted. GUI engine 210 is also configured to emphasize the fitness boundaries for each plot based on the material attribute weights associated with those plots. Thus, since strength and cost are most heavily weighted, fitness boundary 1100 is most visibly emphasized. The other fitness boundaries may be emphasized as well, based on the different weightings associated with the axes of the pots where those boundaries reside.

At step 1420, GUI engine 210 ranks the materials within fitness boundaries based on the material attribute weighting established at step 1418. In doing so, GUI engine 210 may identify one or more highly ranked materials. At step 1422, GUI engine 210 displays the design options associated with these highly ranked materials.

The method 1400 described above may be implemented in conjunction with the method 800 described in conjunction with FIG. 8 in order to provide the end-user with different approaches to viewing, comparing, and evaluating the materials associated with the various available design options 204. In some embodiments, the techniques described thus far may be performed to compare attributes associated with specific design options, as opposed to bulk properties of materials associated with specific design options. Persons skilled in the art will recognize that the examples described herein are provided for exemplary purpose only and are not meant to be limiting.

In sum, a design application generates a spectrum of design options that meet certain design criteria. Each design option may potentially be composed of a different type of material. The design application filters the spectrum of design options for presentation in a graphical user interface (GUI). The GUI illustrates different design options based on material of composition within a parallel axis plot that includes separate axes for different material attributes. The GUI also displays envelopes of design options for each different material or material type, where each envelope has a different color, pattern, opacity, or other visual attribute. A GUI engine dynamically updates the GUI to reflect constraints and other design criteria applied to the spectrum of design options.

At least one advantage of the disclosed approach is that end-users are no longer required to manually and individually evaluate the material attributes associated with each and every design option from a potentially vast collection of design options. Further, the steps of generating a design and selecting a material are integrated, which eliminates or reduces the need for end-users to perform countless iterations between design and simulation when selecting materials.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A non-transitory computer-readable medium including instructions that, when executed by a processor, cause the processor to compare a plurality of design options, by performing the steps of:
generating a spectrum of design options, wherein each design option included in the spectrum satisfies at least one design criterion;
filtering the spectrum of design options to identify a first subset of design options associated with a first material type; and
generating a first envelope that represents the first subset of design options and indicates a first range of values on a first axis corresponding to a first attribute of the first material type and a second range of values on a second axis corresponding to a second attribute of the first material type.

2. The non-transitory computer-readable medium of claim 1, further comprising:
generating a first opacity value for the first envelope based on at least one of the first range of values and the second range of values; and
adjusting the first envelope to be displayed with the first opacity value.

3. The non-transitory computer-readable medium of claim 1, further comprising:
filtering the spectrum of design options to identify a second subset of design options associated with a second material type; and
generating a second envelope that represents the second subset of design options and indicates a third range of values on the second axis corresponding to the first attribute of the first material type and a fourth range of values on the second axis corresponding to the second attribute of the first material type.

4. The non-transitory computer-readable medium of claim 1, further comprising:
generating a second opacity value for a second envelope based on at least one of a third range of values and a fourth range of values; and
adjusting the second envelope to be displayed with the second opacity value.

5. The non-transitory computer-readable medium of claim 1, further comprising:
generating a first band within the first envelope that includes design options associated with a first material having the first material type;
generating a second band within the first envelope that includes design options associated with a second material having the first material type; and
generating different opacity values for the first band and the second band.

6. The non-transitory computer-readable medium of claim 1, further comprising:
determining a first range constraint for the first range of values; and
eliminating a first design option from the first subset of design options that is associated with a first material having a first value for the first material attribute of the first material type that falls outside of the first range constraint.

7. The non-transitory computer-readable medium of claim 1, further comprising:
determining a first weight value for the first attribute of the first material type;
determining a first attribute value of the first material attribute for a first material associated with a first design option included in the first subset;
computing a first attribute score based on the first weight value and the first attribute value; and
identifying that the first design option satisfies at least one design criteria associated with the first material attribute based on the first attribute score.

8. The non-transitory computer-readable medium of claim 7, further comprising:
generating a window corresponding to the first design option; and rendering a visual representation of the first design option in the window.

9. The non-transitory computer-readable medium of claim 1, further comprising:
determining a first range constraint for the first range of values;
determining a second range constraint for the second range of values;
generating a limiting region based on the first range constraint and the second range constraint; and
eliminating a first design option from the first subset of design options that falls outside of the limiting region.

10. The non-transitory computer-readable medium of claim 1, further comprising generating a first fitness boundary that represents at least two material attribute value ranges that both satisfy the at least one design criterion.

11. The non-transitory computer-readable medium of claim 10, further comprising:
identifying a first material associated with a first design option included in the first subset of design options that resides inside the first fitness boundary and inside at least one other fitness boundary; and
identifying a second material associated with a second design option included in the first subset of design options that resides in one or fewer fitness boundaries;
ranking the first material above the second material in the first subset of design options.

12. A computer-implemented method for comparing a plurality of design options, the method comprising:
generating a spectrum of design options;
filtering the spectrum of design options to identify a first subset of design options associated with a first material type; and
generating a first envelope that represents the first subset of design options and indicates a first range of values on a first axis corresponding to a first attribute of the first material type and a second range of values on a second axis corresponding to a second attribute of the first material type.

13. The computer-implemented method of claim 12, further comprising:
generating a first opacity value for the first envelope based on at least one of the first range of values and the second range of values; and
adjusting the first envelope to be displayed with the first opacity value.

14. The computer-implemented method of claim 12, further comprising:
filtering the spectrum of design options to identify a second subset of design options associated with a second material type; and
generating a second envelope that represents the second subset of design options and indicates a third range of values on the second axis corresponding to the first attribute of the first material type and a fourth range of values on the second axis corresponding to the second attribute of the first material type.

15. The computer-implemented method of claim 12, further comprising:
generating a second opacity value for a second envelope based on at least one of a third range of values and a fourth range of values; and
adjusting the second envelope to be displayed with the second opacity value.

16. The computer-implemented method of claim 12, further comprising:

generating a first band within the first envelope that includes design options associated with a first material having the first material type;
generating a second band within the first envelope that includes design options associated with a second material having the first material type; and
generating different opacity values for the first band and the second band.

17. The computer-implemented method of claim 12, further comprising:
determining a first range constraint for the first range of values; and
eliminating a first design option from the first subset of design options that is associated with a first material having a first value for the first attribute of the first material type that falls outside of the first range constraint.

18. The computer-implemented method of claim 12, further comprising:
determining a first weight value for the first attribute of the first material type;
determining a first attribute value of the first material attribute for a first material associated with a first design option included in the first subset;
computing a first attribute score based on the first weight value and the first attribute value; and
identifying that the first design option satisfies at least one design criteria associated with the first material attribute based on the first attribute score.

19. The computer-implemented method of claim 18, further comprising:
generating a window corresponding to the first design option; and
rendering a visual representation of the first design option in the window.

20. The computer-implemented method of claim 12, further comprising:
determining a first range constraint for the first range of values;
determining a second range constraint for the second range of values;
generating a limiting region based on the first range constraint and the second range constraint; and
eliminating a first design option from the first subset of design options that falls outside of the limiting region.

21. The computer-implemented method of claim 12, further comprising generating a first fitness boundary that represents at least two material attribute value ranges that both satisfy the at least one design criterion.

22. The computer-implemented method of claim 21, further comprising:
identifying a first material associated with a first design option included in the first subset of design options that resides inside the first fitness boundary and inside at least one other fitness boundary; and
identifying a second material associated with a second design option included in the first subset of design options that resides in one or fewer fitness boundaries;
ranking the first material above the second material in the first subset of design options.

23. A system for comparing a plurality of design options, comprising:
a memory storing a design application; and
a processor that, when executing the design application, is configured to:
generate a spectrum of design options, filter the spectrum of design options to identify a subset of design options associated with a material type, and generate an envelope that represents the subset of design options and indicates a range of values on an axis corresponding to an attribute of the material type.

24. The system of claim 23, wherein each design option included in the spectrum satisfies at least one design criterion.

25. The system of claim 23, wherein the processor is further configured to generate an additional range of values on an additional axis corresponding to an additional attribute of the material type.

26. The computer-implemented method of claim 12, wherein each design option included in the spectrum satisfies at least one design criterion.

* * * * *